(12) United States Patent
Mallya Kasaragod et al.

(10) Patent No.: US 11,429,762 B2
(45) Date of Patent: Aug. 30, 2022

(54) SIMULATION ORCHESTRATION FOR TRAINING REINFORCEMENT LEARNING MODELS

(71) Applicant: Amazon Technologies, Inc., Seattle, WA (US)

(72) Inventors: Sunil Mallya Kasaragod, San Francisco, CA (US); Sahika Gene, Mercer Island, WA (US); Leo Parker Dirac, Seattle, WA (US); Bharathan Balaji, Seattle, WA (US); Eric Li Sun, Milpitas, CA (US); Marthinus Coenraad De Clercq Wentzel, Seattle, WA (US); Brian James Townsend, San Francisco, CA (US); Pramod Ravikumar Kumar, Santa Clara, CA (US)

(73) Assignee: Amazon Technologies, Inc., Seattle, WA (US)

( * ) Notice: Subject to any disclaimer, the term of this patent is extended or adjusted under 35 U.S.C. 154(b) by 361 days.

(21) Appl. No.: 16/201,872

(22) Filed: Nov. 27, 2018

(65) Prior Publication Data
US 2020/0167437 A1 May 28, 2020

(51) Int. Cl.
G06F 17/10 (2006.01)
G06F 30/20 (2020.01)
G06N 20/00 (2019.01)

(52) U.S. Cl.
CPC ............. *G06F 30/20* (2020.01); *G06N 20/00* (2019.01)

(58) Field of Classification Search
CPC .................................................. G06F 17/5022
(Continued)

(56) References Cited

U.S. PATENT DOCUMENTS 8,418,000 B1  4/2013  Salame
9,110,496 B1  8/2015  Michelsen
(Continued)

FOREIGN PATENT DOCUMENTS

WO      2018194965 A1    10/2018

OTHER PUBLICATIONS

Balaji et al., "DeepRacer: Educational Autonomous Racing Platform for Experimentation with Sim2Real Reinforcement Learning," Nov. 5, 2019, retrieved Apr. 23, 2020, from https://arxiv.org/pdf/1911.01562.pdf, 9 pages.
(Continued)

*Primary Examiner* — Andy Ho
(74) *Attorney, Agent, or Firm* — Davis Wright Tremaine LLP

(57) ABSTRACT

A simulation workflow manager obtains a set of parameters for simulation of a system and training of a reinforcement learning model for optimizing an application of the system. In response to obtaining the set of parameters, the simulation workflow manager configures a first compute node that includes a training application for training the reinforcement learning model. The simulation workflow manager also configures a second compute note with a simulation application to perform the simulation of the system in a simulation environment. Data is generated through execution of the simulation in the second compute node that is provided to the first compute node to cause the training application to use the data to train the reinforcement learning model.

21 Claims, 15 Drawing Sheets

(58) Field of Classification Search
USPC .................................................. 703/13, 22
See application file for complete search history.

(56) References Cited

U.S. PATENT DOCUMENTS

| | | | |
|---|---|---|---|
| 9,378,044 | B1 | 6/2016 | Gaurav et al. |
| 9,671,777 | B1* | 6/2017 | Aichele .................. B25J 9/1666 |
| 10,058,995 | B1* | 8/2018 | Sampedro ................ B25J 9/163 |
| 10,090,791 | B2* | 10/2018 | Saito .................. G05B 13/0265 |
| 10,445,653 | B1 | 10/2019 | Veness et al. |
| 10,587,642 | B1 | 3/2020 | Herman-Saffar et al. |
| 10,786,900 | B1 | 9/2020 | Bohez et al. |
| 2003/0090491 | A1 | 5/2003 | Watanabe et al. |
| 2004/0010603 | A1 | 1/2004 | Foster et al. |
| 2004/0189631 | A1 | 9/2004 | Kazi et al. |
| 2005/0049749 | A1 | 3/2005 | Watanabe et al. |
| 2005/0256606 | A1 | 11/2005 | Irri et al. |
| 2006/0025890 | A1 | 2/2006 | Nagatsuka et al. |
| 2006/0080534 | A1 | 4/2006 | Yeap et al. |
| 2010/0010949 | A1 | 1/2010 | Ito et al. |
| 2011/0125894 | A1 | 5/2011 | Anderson et al. |
| 2012/0004893 | A1 | 1/2012 | Vaidyanathan et al. |
| 2012/0054551 | A1 | 3/2012 | Gao et al. |
| 2013/0283266 | A1 | 10/2013 | Baset et al. |
| 2014/0214394 | A1 | 7/2014 | Inoue |
| 2014/0371905 | A1 | 12/2014 | Eberst et al. |
| 2015/0005547 | A1 | 1/2015 | Freel et al. |
| 2015/0019191 | A1 | 1/2015 | Maturana et al. |
| 2015/0019706 | A1 | 1/2015 | An et al. |
| 2015/0055474 | A1 | 2/2015 | Eyada |
| 2016/0042292 | A1 | 2/2016 | Caplan et al. |
| 2016/0306735 | A1 | 10/2016 | Adderly et al. |
| 2017/0195483 | A1 | 7/2017 | Gault |
| 2017/0270717 | A1 | 9/2017 | Somani et al. |
| 2018/0140203 | A1 | 5/2018 | Wang et al. |
| 2018/0189093 | A1 | 7/2018 | Agarwal et al. |
| 2018/0293498 | A1 | 10/2018 | Campos et al. |
| 2018/0302340 | A1 | 10/2018 | Alvarez Callau et al. |
| 2018/0349482 | A1 | 12/2018 | Oliner et al. |
| 2018/0373781 | A1 | 12/2018 | Palrecha |
| 2019/0026634 | A1 | 1/2019 | Homeyer et al. |
| 2019/0176324 | A1 | 6/2019 | Aukes et al. |
| 2019/0188117 | A1 | 6/2019 | Liu et al. |
| 2019/0261860 | A1 | 8/2019 | Culver et al. |
| 2019/0278698 | A1 | 9/2019 | Ahner et al. |
| 2020/0065704 | A1* | 2/2020 | Nag ........................ G06K 9/627 |
| 2020/0090022 | A1 | 3/2020 | Ma et al. |
| 2020/0090056 | A1 | 3/2020 | Singhal et al. |
| 2020/0150671 | A1 | 5/2020 | Fan et al. |
| 2020/0167687 | A1 | 5/2020 | Genc et al. |

OTHER PUBLICATIONS

International Search Report and Written Opinion dated Mar. 30, 2020, in International Patent Application No. PCT/US2019/062508, filed Nov. 20, 2019.
Dosovitskiy et al., "CARLA: An Open Urban Driving Simulator," 1st Conference on Robot Learning (CoRL '17), Nov. 13, 2017, 16 pages.
Fan et al., "SURREAL: Open-Source Reinforcement Learning Framework and Robot Manipulation Benchmark," 2nd Conference on Robot Learning (CoRL '18), Oct. 29, 2018, 16 pages.
International Search Report and Written Opinion, dated Mar. 16, 2020, International Patent Application No. PCT/US2019/062509, filed Nov. 20, 2019.
Liang et al., "RLlib: Abstractions for Distributed Reinforcement Learning," Proceedings of the 35th International Conference on Machine Learning (ICML '18), Jul. 10, 2018, 10 pages.
Roman et al., "Overseer: A Multi Robot Monitoring Infrastructure," In Proceedings of the 15th International Conference on Informatics in Control, Automation and Robotics, Jul. 2018, vol. 1, pp. 141-148.
Huang et al. "Modelling and designing a low-cost high-fidelity mobile crane simulator," Int J. Human-Computer Studies 58 (2003), pp. 151-176.
Yan et al. "Building a ROS-Based Testbed for Realistic Multi-Robot Simulation: Taking the Exploration as an Example," Robotics 2017, 6(21):1-21.
Chen et al. "A Dynamic Resource Scheduling Method Based on Fuzzy Control Theory in Cloud Environment," Journal of Control Science and Engineering, vol. 2015, 10 pages.
Lauderdale et al., "A Feasibility Study for ISS And HTV Distributed Simulation," AIAA Modeling and Simulation Technologies Conference and Exhibit Aug. 11-14, 2003, 10 pages.
Aguero et al., "Inside the Virtual Robotics Challenge: Simulating Real-Time Robotic Disaster Response," IEEE Transactions on Automation Science and Engineering, 2015, 12(2):494-506.
GITHUB, SurrealAI/symphony (kubernetes.md). [File] Github. com: committed on Oct. 13, 2018; Retrieved from «https://github.com/SurrealAI/symphony/blob/eOd6874f64e93773147ee51dbfe212aa07b/doc/kubernetes.md»
GITHUB, SurrealAI/surreal (creation_settings.md). [File] Github.com: committed on Oct. 27, 2018; Retrieved from «https://github.com/SurrealAI/surreal/blob/86f991befa3884ca934acae7960279771120de/docs/creation_settings.md».
Kubernets, "How to migrate the pods automatically to another node in kubernets?" [Post] stackoverflow.com: submitted on Jul. 19, 2017; Retrieved from «https://stackoverflow.com/question/451891371how-to-migrate-the-pods-automically-to-another-node-in-kubernetes».
Garod, "The Curious Case of Failing Over in Kubernetes" [Post] Medium.com: posted on Oct. 27, 2018; Retrieved from «https://mgarod.medium.com/the-curious-case-of-failing-over-in-kubernetes-fcd16bc9a94d».
GITHUB, openai/gym (frozen_lake.py). [File] Github.com: committed on Feb. 28, 2018; Retrieved from https://github.com/openai/gym/tree/4054fd60adfaf89ecc8cc973971a89a59eb62fc5».
Vilches et al., Whitepaper: "robot_gym: accelerated robot training through simulation in the cloud with ROS and Gazebo," arxiv.org; arXiv:1808.10369 [cs RO]: submitted Aug. 30, 2018.
Fan et al., "Surreal: Open-Source Reinforcement Learning Framework and Robot Manipulation Benchmark," 2nd Conference on Robot Learning {CoRL 2018}: Zurich, Switzerland; published online Oct. 28, 2018; Retrieved from «https://github.com/mlresearch/v87/blob/gh-pagess/fan18a/fan 18a.pdf».
US2020/0076857, dated Mar. 5, 2020, Van Seijen et al.
US2015/0338162, dated Nov. 26, 2015, Hoffman.
US2018/0088571, dated Mar. 29, 2018, Weinstein-Raun.
US2018/0189101, dated Jul. 5, 2018, Xu et al.
US2019/0025803, dated Jan. 24, 2019, Akitomi.
US2020/0167686, dated May 28, 2020, Mallya Kasaragod et al.
US2022/0048187, dated Feb. 17, 2022, Rudenko et al.
US2019/0272465, dated Sep. 5, 2019, Kimura et al.

* cited by examiner

FIG. 9

| Services ▶ | Resource Groups ▶ | 🔔 | N. Topeka ▶ | Support ▶ |

Robot — 902

Reinforcement Learning

Leaderboards

904

Specify a machine learning framework, an optimization algorithm and hyperparameters.

Hyperparameters

Batch size — 906
- ● 32
- ○ 64
- ○ 128
- ○ 256
- ○ 512

Number of epochs — 908: ◀ 3 ▶

Stack size — 910: ◀ 1 ▶

Learning rate — 912: ◀ 0.001 ▶

Exploration
Categorical Parameters — 914
○ Epsilon Greedy
● Entropy — 916: ◀ 0.5 ▶

Discount factor — 918: ◀ 1 ▶

| Feedback | English U.S. | Privacy Policy | Terms of Use |

SIMULATION ORCHESTRATION FOR TRAINING REINFORCEMENT LEARNING MODELS

CROSS-REFERENCE TO RELATED APPLICATIONS

This application incorporates by reference for all purposes the full disclosures of co-pending U.S. patent application Ser. No. 16/201,830, filed concurrently herewith, entitled "REINFORCEMENT LEARNING MODEL TRAINING THROUGH SIMULATION" and U.S. patent application Ser. No. 16/201,864, filed concurrently herewith, entitled "SIMULATION MODELING EXCHANGE".

BACKGROUND

Developers of applications and computer systems often rely on reinforcement learning to enable an application or system to learn which actions to perform in a particular environment in order to achieve some specified goal. However, the creation of a virtual simulation environment that can be used to perform reinforcement learning for an application or other system can be difficult. Further, configuring an agent to perform exploration within the simulation environment to enable reinforcement learning for the application and system can be time-intensive and prone to error, as developers may need to avoid errors in the programming of the agent. Additionally, defining a reinforcement learning function that can be used for the reinforcement learning process can also be time-intensive, requiring significant trial and error to ensure that the reinforcement learning is performed correctly.

BRIEF DESCRIPTION OF THE DRAWINGS

Various techniques will be described with reference to the drawings, in which:

FIG. 9 shows an illustrative example of an interface for specifying the machine learning framework for training the reinforcement learning model in accordance with at least on embodiment;

DETAILED DESCRIPTION

Figure 1:
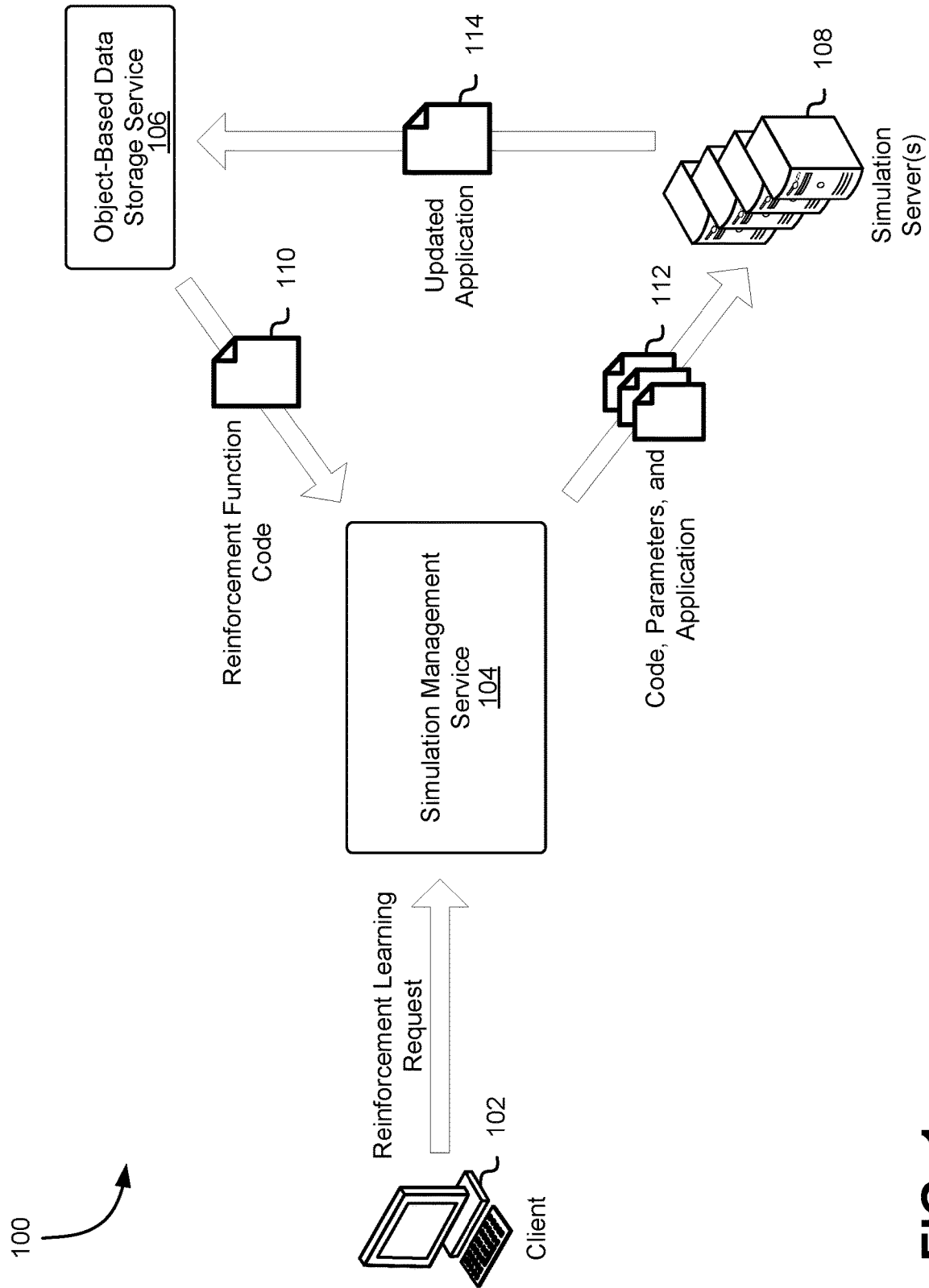
FIG. 1 shows an illustrative example of a system in which various embodiments can be implemented.

Techniques described and suggested herein relate to the development and training of a reinforcement learning model for an application to enable performance of operations, by a system through execution of the application, to achieve a specified goal or objective. In an example, a simulation management service receives a request, from a customer, to perform reinforcement learning for a set of robotic devices. The request may include computer-executable code defining a custom-designed reinforcement function for training a reinforcement learning model for the set of robotic devices. In an example, the simulation management service provides, through a graphical user interface (GUI), an editor that the customer may use to define the computer-executable code. Through the GUI, the customer may identify the simulation environment of the robotic devices, as well as other parameters that may be used to define the characteristics of the robotic devices (e.g., what sensors will be utilized by the robotic devices, the different movement mechanisms of the robotic devices, etc.) and to define any dynamic obstacles present in the simulation environment. The simulation management service may evaluate the provided parameters and the simulation environment to identify the variables in the simulation environment that may affect the system performance (e.g., learning the reinforcement learning model) and may expose these variables to the customer as function parameters in the editor. The customer may utilize any of these variables to build the custom-designed reinforcement function.

In an example, the simulation management service evaluates the provided custom-designed reinforcement function and determines whether to initiate a training simulation using the simulation environment and the reinforcement function. Based on this evaluation, the simulation management service may provide, through the GUI, suggestions for modification of the reinforcement function. The customer may use these suggestions to modify and re-submit the custom-designed reinforcement function. In an example, once the custom-designed reinforcement function has been created and stored, the customer can submit a request to perform reinforcement learning for the set of robotic devices using a particular simulation application that is to be improved via use of the reinforcement function and a reinforcement learning model.

In response to the request, the simulation management service may provision a software container instance for performing the simulation of the robotic device using the reinforcement learning model. Further, the simulation management service may provision another software container instance for training the reinforcement learning model based on data obtained through performance of the simulation of the robotic device. The simulation management service may inject the custom-defined reinforcement function into the application and execute the application in the simulation environment generated within the corresponding software container instance. The application may select an initial simulation environment state and a corresponding action to be performed by the robotic device in the simulation environment. Based on the simulation environment state achieved through execution of the action, the application may determine, based on the reinforcement function, a reward value. The simulation application may transmit this information to the training application operating in the other software container instance to cause the training application to use this information to update the reinforcement learning model.

In an example, the training application uses the data from the simulation application to update the reinforcement learning model. The training application may transmit the updated reinforcement learning model to the simulation application, which may update its version of the reinforcement learning model and inject this updated model into the application. Thus, the simulation application may perform additional simulations of the robotic device using the updated reinforcement learning model and generate new data that may be used to continue updating the model. This cycle may continue until a termination condition is met. For instance, the simulation of the robotic device may be subject to a timeout condition, whereby the simulation is terminated once a particular period of time has elapsed. Alternatively, the simulation of the robotic device may be terminated if the maximum reward value identified via the function has been attained over the last several simulation attempts using the reinforcement learning model.

In an example, if the reinforcement learning model has been finalized, the customer can request, through the GUI, implementation of the reinforcement learning model into the robotic device application. In response to the request, the simulation management service may update the robotic device application to incorporate the reinforcement learning model. If the robotic device application has been previously implemented onto a fleet of robotic devices, the simulation management service may push an over-the-air (OTA) update to the fleet of robotic devices that may cause the fleet of robotic devices to modify the robotic device application to incorporate the new reinforcement learning model.

In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

As one skilled in the art will appreciate in light of this disclosure, certain embodiments may be capable of achieving certain advantages. For example, because customers can develop their own custom-defined reinforcement function through use of the GUI, using permissible simulation environment variables provided by the simulation management service, customers are given considerable flexibility in creating a reinforcement learning model and reduces the amount of time required to do so. Additionally, because the simulation application and the training application are implemented on separate software container instances, the training of the reinforcement learning model can happen rapidly, through use of an asynchronous communication system between the instances. Further, because the customer is provided with a GUI to monitor performance of the simulation, the simulation management service may provide, in real-time, information detailing the progress of the training of the reinforcement learning model. Through this GUI, the customer can cancel the process at any time, which causes the simulation management service to terminate each of the respective components and to store data that has been specifically stored through the training process.

FIG. 1 shows an illustrative example of a system 100 in which various embodiments can be implemented. In the system 100, a customer of the simulation management service 104, through a client device 102, submits a request to the simulation management service 104 to create and simulate a robotic device application that may be installed on a set of robotic devices through training of a reinforcement learning model. The simulation management service 104 may comprise a collection of computing resources that collectively operate to provide ROS tools and libraries to allow customers of the simulation management service 104 to create custom applications that may be implemented on to a fleet of robotic devices. Further, the simulation management service 104 may extend the ROS tools and libraries to other computing resource services. For example, through the simulation management service 104, a customer may define a robotic device application that leverages services that convert text into speech, which may be used to enable communication between the robotic devices and the customer using natural language understanding (NLU). Additionally, the customer may define an application that leverages a video streaming service of the computing resource service provider to enable real-time streaming of video captured by the robotic devices to the customer via the simulation management service. Thus, the simulation management service 104 may serve to coordinate interactions among the customer, robotic devices, and the myriad services made available by the computing resource service provider.

In an embodiment, the simulation management service 104 provides a customer, through the client device 102, with an interface usable to create the robotic device application, specify the parameters for a simulation of the robotic device application, define and organize fleets of robotic devices, communicate with the robotic devices over encrypted communications channels, and obtain data from the robotic devices executing the robotic device application. Through this interface, the simulation management service 104 may expose the various ROS tools and libraries that the customer may select to create the robotic device application. For instance, the simulation management service 104 may provide, through the interface, a code editor that may be used by the customer to define the computer-executable code that comprises the robotic device application. Further, the simulation management service 104 may provide, in addition to the code editor, graphical representations of modules corresponding to functionality made available through other computing resource services, such as those described above. The customer, through the interface, may select any of these modules to add these modules to the code editor in the form of computer-executable code.

The simulation management service 104 may evaluate a robotic device application created through the interface to identify any errors that may prevent proper execution of the application in a simulation environment and on the robotic devices. For instance, the simulation management service 104 may evaluate the computer-executable code for any compilation errors, conflicting commands, undefined parameters or variables, and the like. Additionally, the simulation management service 104 may provide suggestions for enhancing the computer-executable code. For example, if the customer has specified, through the computer-executable code, that data is to be obtained through a video stream of the robotic devices executing the application, the simulation management service may suggest implementing a module that leverages services that convert text into speech, whereby the text may be detected via the video stream.

In an embodiment, the customer, through the interface, can register a set of robotic devices with the simulation management service 104 to enable organization of these robotic devices into logical groupings that may be maintained by the simulation management service 104. Robotic devices may include autonomous devices (e.g., "driverless" vehicles, appliances, unmanned aerial vehicles, space exploration vehicles, satellites, etc.) that may perform operations based on sensor data collected via analysis of a surrounding environment of the autonomous devices. It should be noted that robotic devices, as described throughout the disclosure, may refer to physical robotic devices and/or to simulated robotic devices, which may be a representation of the physical robotic devices but in a simulated environment. Through the interface, the customer may utilize various application programming interface (API) calls to register a new robotic device. For example, the customer may submit, through use of a RegisterDevice( ) API call, a unique name for the robotic device that may be used to associate the robotic device with the customer's account. In an embodiment, the RegisterDevice( ) API call is required for registration of the robotic device and the name of the robotic device, a unique Internet-of-Things (IoT) name of the robotic device, and the name of the logical grouping to which the robotic vehicle belong to is provided as a string. For instance, the customer may submit, through use of an RegisterDevice( ) API call, a unique IoT name for the robotic device, which may be used to establish the encrypted communications channel between the simulation management service 104 and the robotic device. Additionally, through the RegisterDevice( ) API, the customer may define the logical grouping that the robotic device is to be a part of. This logical grouping may be an existing grouping of robotic devices previously created by the customer or a new logical grouping that the customer has defined. Optionally, the customer, through the RegisterDevice( ) API call, may define a client token that may be used to correlate requests and responses between the robotic device and the simulation management service 104, as described in greater detail below.

The customer, through use of a DeregisterDevice( ) API call, can submit a request to deregister an existing robotic device from its account. In response to this API call, the simulation management service 104 may update a database to update the registration status of the robotic device and initiate a workflow to deregister the robotic device. In an embodiment, the DeregisterDevice( ) API call includes the unique name of the robotic device that is to be deregistered as a string.

During this registration process, the simulation management service 104 may require the customer to create a digital certificate for the robotic device in order to allow for authentication of the robotic device in communications with the simulation management service 104 and any other services of the computing resource service provider. The customer may use a CreateDeviceCertificates( ) API call, specifying the IoT name for the robotic device, to request creation of the digital certificate for the robotic device. In response to the request, the simulation management service may communicate with a network-connected device service to generate IoT thing information for the robotic device and the digital certificate. Further, the simulation management service 104 may transfer the digital certificate to the robotic device to enable the robotic device to present the digital certificate for authentication. In an embodiment, the simulation management service 104 transmits a communications channel application to the robotic device that, if installed and executed on the robotic device, enables the robotic device to interact with the simulation management service 104 and other computing resource services and to present the digital certificate for authentication.

In an embodiment, the customer submits a request to the simulation management service 104 to initiate simulation of the robotic device application within a simulation environment to perform a set of tests on the robotic device application and/or to train a reinforcement learning model that can be implemented through the robotic device application. For instance, the customer may use the simulation of the robotic device application to gauge the performance of a simulation of the robotic device in the simulation environment. This may allow the customer to adjust the robotic device application such that the robotic device may achieve better results through execution of the robotic device application. In the request, the customer may specify a set of system parameters and a set of simulation parameters, both of which may be used to generate a simulation environment and to perform the simulation of the robotic device application.

In an embodiment, the customer, through the client device 102, submits a request to train a reinforcement learning model, which may be used to optimize a robotic device application that may be installed on to robotic devices of a fleet of robotic devices. In the request, the customer may provide a custom-designed reinforcement learning function, which may be used to define a set of reward values corresponding to actions performable by the robotic device based on an initial state of the simulation environment and the resulting state of the simulation environment. In an embodiment, the simulation management service 104 presents the customer with a code editor, through which the customer may define, using computer-executable code, the reinforcement learning function for training the reinforcement learning model. Through the code editor, the customer may generate the computer-executable code using any programmatic language (e.g., Python, C++, etc.). Once the customer has defined, through the code editor, the computer-executable code defining the reinforcement function, the simulation management service 104 may evaluate the computer-executable code to identify any errors that may prevent compilation of the computer-executable code. Further, the simulation management service 104 may identify one or more snippets of the computer-executable code that define the reward values for a set of state-action tuples. The simulation management service 104 may provide these snippets of code to the customer through the interface. In an embodiment, the simulation management service 104 also evaluates the computer-executable code, including the functions identified and presented through the interface, to identify a set of suggestions that may be used to enhance the reinforcement function. These suggestions may be based on historical use of the code editor to generate computer-executable code for reinforcement functions applied to the selected simulation environments using similar robotic devices. These suggestions may be presented to the customer via the interface, which may include a modified version of the functions identified by the simulation management service 104 from the customer-submitted reinforcement function. Through the interface, the customer may determine whether to implement the suggestions provided by the simulation management service 104 into the custom-designed reinforcement function.

In an embodiment, the custom-designed reinforcement function is stored as computer-executable code 110 in a data object within an object-based data storage service 106. The object-based data storage service may be a service provided by a computing resource service provider. The object-based data storage service may be implemented on a computer system, or abstraction thereof (such as one or more virtual machines operating via a hypervisor), implemented using hardware and software, and may comprise one or more processors and memory that stores executable instructions whose execution by the one or more processors causes the computer system to perform operations described herein. The data stored in the object-based data storage service may be organized into data objects. The data objects may have arbitrary sizes and may, in some instances, have constraints on size. Thus, the object-based data storage service may store numerous data objects of varying sizes. The object-based data storage service may operate as a key value store that associates data objects with identifiers of the data objects which may be used by the customer or other entity (e.g., the simulation management service 104, etc.) to retrieve or perform other operations in connection with the data objects stored by the object-based data storage service. Access to the object-based data storage service may be through API calls to the service or via an interface, such as a graphical user interface (GUI).

In an embodiment, the customer submits, through the client device 102, a request to the simulation management service 104 to train a reinforcement learning model usable to optimize a robotic device application. The request may specify the name of the reinforcement learning model to be trained, as well as the computer-executable code 110 that defines the custom-designed reinforcement function for training the reinforcement learning model. The request to train the reinforcement learning model may also include a set of parameters, including a set of simulation parameters and a set of system parameters. The set of simulation parameters may include a set of hyperparameters for performing the simulation and training the reinforcement learning model usable to optimize the application. For instance, the set of simulation parameters may include the batch size for the simulation, which may be used to determine the GPU requirements for the simulation. For example, the number of GPUs required for the simulation may increase in proportion to the batch size specified by the customer via the interface provided by the simulation management service 104. The customer may also specify, through the interface, the number of epochs, which may correspond to the number of times the data generated through simulation of the application is processed to train the reinforcement learning model. Similarly, through the interface, the customer may define the stack size for the simulation, the learning rate, the exploration parameters, the entropy rate, the discount factor, the loss type, and the number of episodes between each training iteration for the reinforcement learning model. In an embodiment, through the interface, the customer can also define the termination conditions for the simulation. For instance, the customer can specify the criteria for a simulation to terminate, including maximum time or maximum number of runs from the start of the simulation to its conclusion or failure. The simulation parameters may further include the dimensions of a simulated room, the location of any obstacles to be encountered by the robotic device, the location of any objects that the robotic device can interact with, the initial position of the robotic device, a desired position of the robotic device at the end of the simulation, and the like. The system parameters may include the names of the robotic devices that are to be tested via the simulation environment. These parameters may further include the sensors to be utilized by the robotic devices, the movement capabilities and limitations of the robotic devices, and the like.

In response to the request from the customer, the simulation management service 104 may obtain the computer-executable code 110 for the custom-designed reinforcement function from the data object in the object-based data storage service 106. Additionally, from this data object, the simulation management service 104 may obtain the robotic device application that is to be executed in the simulation environment and optimized based on the training of the reinforcement learning model. The simulation management service 104 may transmit the computer-executable code 110, the set of parameters, and the robotic device application (collectively represented in FIG. 1 as the code, parameters, and application 112) to a set of simulation servers 108 for execution of the simulation and training of the reinforcement learning model.

In an embodiment, the simulation management service 104 transmits a request to a simulation workflow manager of a virtual computer system management service to configure the simulation of the application. The request may include the set of parameters defined by the customer through the interface for the simulation. Further, the request may include the network address corresponding to the data object in the object-based data storage service 106 where the application is stored and where the reinforcement learning model is to be stored once the simulation has been completed. In response to the request, the simulation workflow manager may initiate configuration of the simulation of the application. The simulation workflow manager is implemented on a computer system or abstraction thereof (such as one or more virtual machines operating via a hypervisor), implemented using hardware and software, and can comprise one or more processors and memory that stores executable instructions whose execution by the one or more processors causes the computer system to perform operations described herein. The simulation workflow manager, as described below, may manage and monitor the various simulation servers to ensure that execution of the simulation and that the training of the reinforcement learning model is completed successfully.

In response to the request, the simulation workflow manager may access the object-based data storage service 106 to obtain the application that is to be simulated and optimized based on training of the reinforcement learning model specified by the customer using the custom-designed reinforcement function defined by the customer via the simulation management service 104. Further, the simulation workflow manager may evaluate the various parameters provided by the customer and the system requirements for the various components of the simulation to determine what virtual computing instances are to be provisioned in order to support execution of the application in the simulation environment and to configure (e.g., generate a simulation environment or modify an existing simulation environment) the simulation environment. Based on these computational requirements, the simulation workflow manager may provision a set of virtual computing instances within the set of simulation servers 108 to execute the simulation of the application. In an embodiment, if the simulation of the application is being performed using existing virtual computing instances, the simulation management service 104 can configure the existing simulation environment of this simulation to incorporate the reinforcement learning function and to incorporate the various parameters provided by the customer, which may be used to modify the existing simulation environment. The existing simulation environment may be, for example, a simulation environment that has been pre-provisioned for the customer or, selected from a pool of pre-provisioned simulation environments for customers and then allocated to the customer. Code for the reinforcement learning function may be provided as an input into the existing simulation environment, e.g., through an API exposed by the simulation environment, by loading a configuration file onto the simulation environment, or otherwise passing data defining the function to the existing simulation environment.

In an embodiment, the simulation workflow manager allocates the various components of the simulation among different virtual computing instances on the simulation servers 108 based on the system requirements of the components and the capabilities of the virtual computing instances. For instance, the simulation workflow manager may create, from the set of components, discretizable subsets of the simulation that may be apportioned among the virtual computing instances. The simulation workflow manager may place a first set of components corresponding to a subset of the simulation within a virtual computing instance. If there is remaining capacity for additional components in the virtual computing instance, the simulation workflow manager may allocate the next set of components within the same virtual computing instance. Otherwise, the simulation workflow manager may allocate the next subset of the simulation on to another virtual computing instance. The simulation workflow manager may continue this process until all components of the simulation have been allocated among the various virtual computing instances within the simulation servers 108.

In an embodiment, the simulation workflow manager establishes, between each virtual computing instance utilized for the simulation, a network interface to enable secure communications among the various components of the simulation. The simulation workflow manager may map the simulation to the customer's own virtual private network (as identified via the request) and/or to a customer's own virtual computing instances operating within an on-premises network. In an embodiment, the simulation workflow manager maintains, within a simulation server 108, a training application container that performs training of the reinforcement learning model based on actions performed by the simulated robotic device within the simulation environment based on the state of the robotic device and simulation environment prior to and after execution of the action. The training of the reinforcement learning model may further take into account the reward value, as determined via the custom-designed reinforcement function, corresponding to the action performed, the initial state, and the state attained via execution of the action. The training application container may provide the updated reinforcement learning model to a simulation application container to utilize in the simulation of the application and to obtain new state-action-reward data that may be used to continue updating the reinforcement learning model.

In an embodiment, simulation data generated by the virtual computing instances via execution of the simulation is transmitted to a computing resource monitoring service where it is stored and may be accessed by the customer via the simulation management service 104. For instance, the simulation management service 104 may obtain the simulation data from the computing resource monitoring service and store the data in a repository, where it is made available to customers of the simulation management service 104. In an embodiment, the simulation servers 108 provide, via one or more visualization applications, access to the simulation in real-time. This may allow customer, via the simulation management service 104, to evaluate performance of the simulation during execution of the simulation.

The simulation workflow manager may monitor execution of the simulation to determine whether a termination condition has been satisfied. For instance, if the maximum allowable time for execution of the simulation has elapsed, the simulation workflow manager may terminate the simulation and use the reinforcement learning model, updated via the simulation, to optimize the application and create an updated application 114. Alternatively, a termination condition may be satisfied if the maximum number of iterations for the simulation has been reached. In some instances, a termination condition may be defined by the attainment of an average reward value for the simulation through execution of actions in the simulation environment over a minimum number of iterations of the simulation. If any of these termination conditions are met, the simulation workflow manager may update the application based on the latest reinforcement learning model and store the updated application 114 and the latest reinforcement learning model in the object-based data storage service 106. It should be noted that while data objects and an object-based data storage service are utilized extensively throughout the present disclosure for the purpose of illustration, other storage mechanisms may be used for storing the updated application 114. For instance, the simulation workflow manager may rely on a version-control system (e.g., Git, etc.) to track changes to the application 114 and to the reinforcement learning model. Further, the simulation workflow manager may utilize any other available code repository to store the updated application 114 and the reinforcement learning model.

Additionally, the simulation workflow manager may transmit a notification to the simulation management service 104 to indicate that the simulation of the application and the training of the reinforcement learning model has been completed. In response to this notification, the simulation management service 104 may transmit a notification to the customer via the client device 102 to indicate completion of the simulation and training of the reinforcement learning model. It should be noted that while robotic devices and robotic device applications are used extensively throughout the present disclosure, other systems that utilize the reinforcement learning model to update applications and other computer-executable code may rely on the techniques described herein to train and utilize a reinforcement learning model. The other systems may include computer systems or any other hardware-based system that uses machine learning models, software systems that use machine learning models, distributed systems that rely on both hardware-based and software-based systems and the like.

Figure 2:
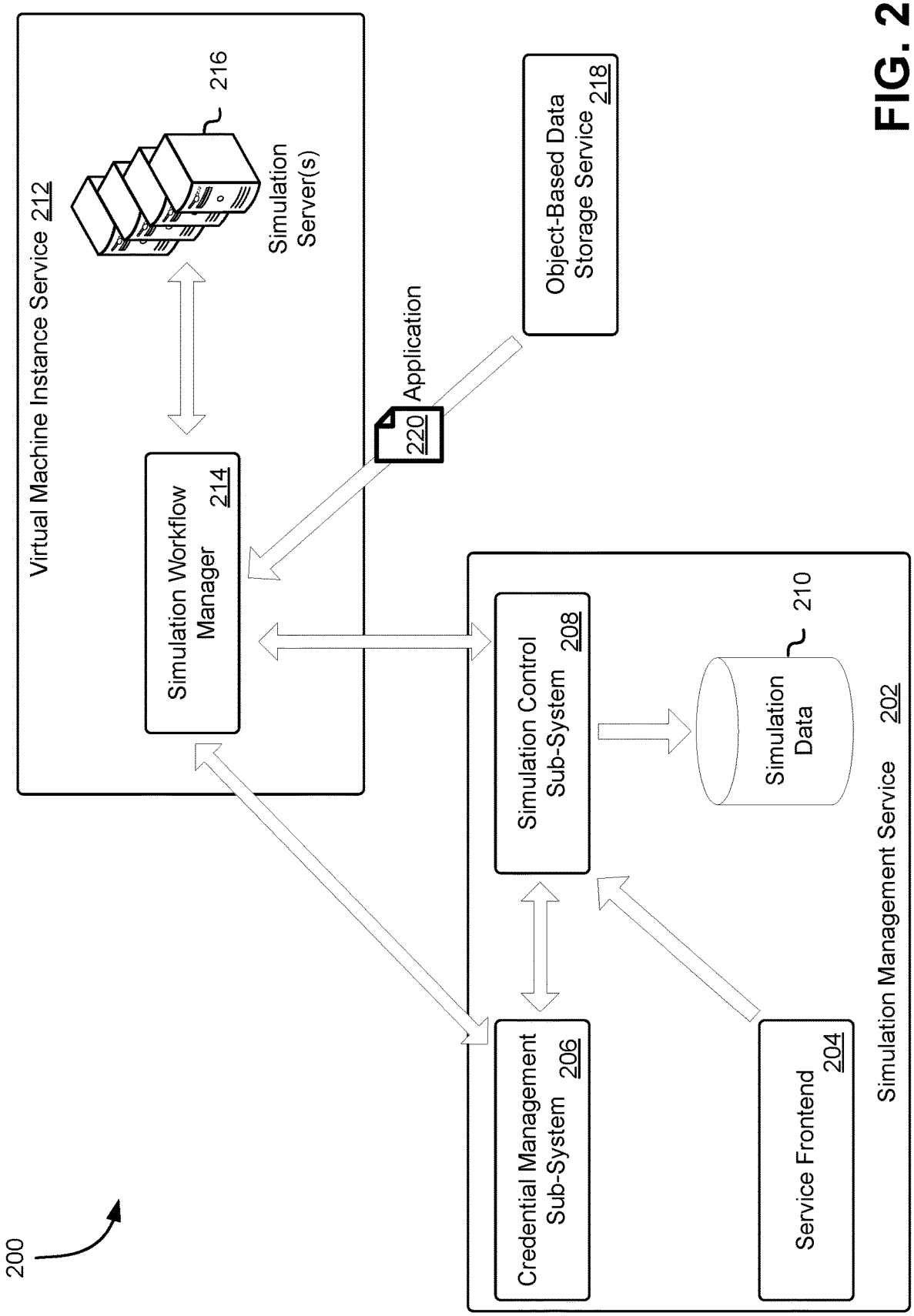
FIG. 2 shows an illustrative example of a system in which a simulation environment for a system is generated using a set of simulation servers to obtain data usable to update a robotic device application in accordance with at least one embodiment.

FIG. 2 shows an illustrative example of a system 200 in which a simulation environment for a system is generated using a set of simulation servers 216 to obtain data usable to update an application 220 in accordance with at least one embodiment. In the system 200, a customer of the simulation management service 202 submits, through a service frontend 204, a request to initiate a simulation of a robotic device executing an application 220 and to train a reinforcement learning model usable to update and optimize the application 220. Through the service frontend 204, the customer may define a set of system parameters and a set of simulation parameters, both of which may be used to generate a simulation environment and to perform the simulation of the robotic device application 220.

The system parameters may include the names of the robotic devices that are to be tested via the simulation environment. These parameters may further include the sensors to be utilized by the robotic devices, the movement capabilities and limitations of the robotic devices, and the like. The simulation environment parameters may include the dimensions of a simulated room, the location of any obstacles to be encountered by the robotic device, the location of any objects that the robotic device can interact with, the initial position of the robotic device, a desired position of the robotic device at the end of the simulation, and the like. In an embodiment, through the service frontend 204, the customer can define computer-executable code defining a custom-designed reinforcement function for training a reinforcement learning model for the robotic devices. For instance, the customer may specify, via an API call to the service frontend 204 (e.g., StartEvaluation( ) etc.) to initiate simulation of a particular application 220, the resource name for the reinforcement function that is to be used in training a reinforcement learning model for the application 220, the resource name of the simulation environment to be used for the evaluation, the termination conditions for the simulation (e.g., timeout periods, model convergence requirements, etc.) and the location and name of the data object utilized for storage of data generated via the simulation.

In an embodiment, the StartEvaluation( ) API call is used to create a new evaluation job (e.g., simulation and training) for a reinforcement learning model. The StartEvaluation( ) API call can include, as a string, the resource name of the reinforcement learning model that is to be trained, the resource name of the simulation environment defined by the customer through the interface, the location of a document or file that includes the termination conditions for the simulation, and the data object to be used for storage of simulation artifacts. In response to this API call, the service frontend 204 may provide the customer with a unique resource name corresponding to the simulation. This unique resource name may be used by the customer to request information regarding the evaluation or to perform other operations. For instance, through a GetEvaluation( ) API call, the customer can get information about the simulation for training a reinforcement learning model. The GetEvaluation( ) API call can include, as a string, the resource name of the evaluation. In response to this API call, the service frontend 204 may provide the network address of the data object that includes the details of the simulation. Alternatively, the service frontend 204 may access the data object to obtain the details of the simulation and provide the details directly to the customer.

In an embodiment, the customer can submit, through the service frontend 204, a ListEvaluations( ) API call to obtain an ordering of the simulations being performed for training a reinforcement learning model. The ListEvaluations( ) API call can include, as a string, the resource name of the reinforcement learning model. Optionally, the customer may define, in addition to the resource name, the maximum number of results to be returned per interface page, fields usable to sort the results by (e.g., creation time, etc.), the sort order for the results (e.g., ascending, descending, etc.), and a filter that is usable to retrieve only simulations with a specific status (e.g., in progress, completed, failed, stopping, stopped, etc.). In an embodiment, the customer can also submit, through the service frontend 204, a StopEvaluation( ) API call to stop a particular simulation for training the reinforcement learning model. The StopEvaluation( ) API call can include, as a string, the resource name of the simulation that is to be stopped.

In an embodiment, the customer can use an API call to the service frontend 204 (e.g., ImportModel( ) to import a reinforcement learning model and the computer-executable code defining the custom-designed reinforcement function. The API call may include, as parameters in a string, a unique name for the reinforcement learning model, the model type, the framework for the model, a description of the model, and the location of any model artifacts. Additionally, the customer can submit a DeleteModel( ) API call to request deletion of a reinforcement learning model from the customer's account and from a database maintained by the simulation management service 202 detailing each available reinforcement learning model. The DeleteModel( ) API call can include, as a string, the identity of the reinforcement learning model. This may either be the name and type of the reinforcement learning model or the resource name of the reinforcement learning model that is to be deleted. The customer can also submit a GetModel( ) API call to request information for a specific reinforcement learning model. The GetModel( ) API call can include, as a string the identity of the reinforcement learning model, as described above. In an embodiment, the customer can use a ListModels( ) API call to the service frontend 204 to retrieve information for all reinforcement learning models available to the customer. The GetModel( ) API may include, as a string, the type of model to be retrieved (e.g., reinforcement learning models, object detection models, etc.), a pagination token, the maximum number of results to be returned on an interface page, the fields usable to sort results by (e.g., creation time, etc.), and the sort order for the results (e.g., ascending, descending, etc.).

In an embodiment, through the service frontend 204, the customer can submit a CreateReinforcementLearningModel( ) API call to the simulation management service 202 to request creation of a reinforcement learning model that may be trained for an application 220. The CreateReinforcementLearningModel( ) API call can include, as a string, a unique name for the reinforcement learning model, the machine learning framework for the model (e.g., TensorFlow, MXNet, PyTorch, etc.), a description of the model, the algorithm for a system simulation agent performing the simulation using the model, the network of the agent, and the configuration of the training to be performed (e.g., a data object that defines how the model is to be trained, etc.).

In an embodiment, through the service frontend 204, the customer can submit a GetTrainingJob( ) API call to the simulation management service 202 to obtain information about a training job (e.g., simulation) being performed for training a reinforcement learning model. The GetTrainingJob( ) API call may include, as a string, the resource name corresponding to the simulation being performed. For instance, when the customer submits a request to perform a simulation of the robotic device application 320 to train a reinforcement learning model, the service frontend 204 may provide the customer with a unique resource name for the simulation.

Thus, through the API call, the customer may specify this unique resource name to obtain the details and status of the simulation. Through the service frontend 204, the customer may also submit a ListTrainingJobs( ) API to obtain an ordering of the simulations being performed to train the reinforcement learning model. The ListTrainingJobs( ) API call may include, as a string, the resource name of the reinforcement learning model, the maximum number of results to be returned on an interface page, and a pagination token. In response to this API call, the service frontend 204 may return the ordering of data objects that include the simulation details.

In an embodiment, through the service frontend 204, the customer can submit a StopTrainingReinforcementLearningModel( ) API call to stop training of a particular reinforcement learning model. This API call may include, as a string, the resource name of the reinforcement learning model for which training is to cease. Through the service frontend 204, the customer may also submit a CloneReinforcementLearningModel( ) API call to request cloning of an existing reinforcement learning model. The CloneReinforcementLearningModel( ) API call may include, as a string, the resource name of the reinforcement learning model to be cloned, a unique name for the new reinforcement learning model, the data object where the new reinforcement learning model artifacts are to be stored, and the data object or other file that defines how the new reinforcement learning model is to be trained.

Through the service frontend 204, the customer may define a set of hyperparameters for simulating the application 220 and training a reinforcement learning model usable to optimize the application 220. For example, the customer may define the batch size for the simulation, which may be used to determine the GPU requirements for the simulation. For example, the number of GPUs required for the simulation may increase in proportion to the batch size specified by the customer via the interface provided by the service frontend 204. The customer may also specify, through the interface, the number of epochs, which may correspond to the number of times the data generated through simulation of the application 220 is processed to train the reinforcement learning model. Similarly, through the interface, the customer may define the stack size for the simulation, the learning rate, the exploration parameters, the entropy rate, the discount factor, the loss type, and the number of episodes between each training iteration for the reinforcement learning model. In an embodiment, through the interface, the customer can also define the termination conditions for the simulation. For instance, the customer can specify the criteria for a simulation to terminate, including maximum time or maximum number of runs from the start of the simulation to its conclusion or failure.

In an embodiment, through the interface, the customer can define the simulation environment. For instance, the service frontend 204 may present to the customer, through the interface, different simulation environment templates that may be used to create a simulation environment for simulating the application 220. Through the interface, the customer may select and modify any of the simulation environment templates to define the simulation environment to be used in simulating and testing the application 220 and training the reinforcement learning model. Additionally, the customer may define the name of the reinforcement learning model and the custom-designed reinforcement function to be used to train the reinforcement learning model. The customer, through the interface, can request provisioning of a data object within an object-based data storage service 218 for storage of the application 220, the custom-designed reinforcement function, and the reinforcement learning model. Through the interface, the customer may also identify any access control policies that may be used to give the robotic device permission to perform actions in other services on behalf of the customer, including the data object.

The service frontend 204 may transmit the request to a simulation control sub-system 206 of the simulation management service 202 to initiate creation of the simulation environment for training the reinforcement learning model and optimizing the application 220. The simulation control sub-system 206 is implemented on a computer system or abstraction thereof (such as one or more virtual machines operating via a hypervisor), implemented using hardware and software, and can comprise one or more processors and memory that stores executable instructions whose execution by the one or more processors causes the computer system to perform operations described herein. The simulation control sub-system 206 may obtain, from a credential management sub-system 208, a set of credentials usable for authentication when submitting a request to a simulation workflow management 214 of a virtual computer system management service 212. The set of credentials may be generated by the simulation management service 202 and maintained by the credential management sub-system 208 to enable other components of the simulation management service 202 to access other services provided by the computing resource service provider.

The credential management sub-system 208 is implemented on a computer system or abstraction thereof (such as one or more virtual machines operating via a hypervisor), implemented using hardware and software, and can comprise one or more processors and memory that stores executable instructions whose execution by the one or more processors causes the computer system to perform operations described herein. In some examples, the credentials maintained by the credential management sub-system are provided by the customer, whereby the credentials may be used by the simulation control sub-system 206 to enable access to the customer's resources within the virtual computer system management service 212 and other services to enable simulation of the application 220. Alternatively, the credentials maintained by the credential management sub-system 208 may be generated by the simulation management service 202 itself, whereby the simulation servers 216 and virtual computing instances provisioned on these simulation servers 216 are part of a pool of resources of the simulation management service 202 usable to simulate applications designated by customers of the simulation management service 202.

The simulation control sub-system 206 may transmit a request to a simulation workflow manager 214 of the virtual computer system management service 212 to configure the simulation of the application 220. The request may include the set of parameters defined by the customer through the service frontend 204 for the simulation. Further, the request may include the set of credentials from the credential management sub-system 208 and the network address corresponding to the data object in the object-based data storage service 218 where the application 220 is stored and where the reinforcement learning model is to be stored once the simulation has been completed. In response to the request, the simulation workflow manager 214 may interact with the credential management sub-system 208 to validate the obtained set of credentials from the simulation control sub-system 206. If the set of credentials are valid, the simulation workflow manager 214 may initiate configuration of the simulation of the application 220. The simulation workflow manager 214 is implemented on a computer system or abstraction thereof (such as one or more virtual machines operating via a hypervisor), implemented using hardware and software, and can comprise one or more processors and memory that stores executable instructions whose execution by the one or more processors causes the computer system to perform operations described herein.

In response to the request, the simulation workflow manager 214 may access the object-based data storage service 218 to obtain the application 220 that is to be simulated and optimized based on training of the reinforcement learning model specified by the customer user the custom-designed reinforcement function defined by the customer via the service frontend 204. Further, the simulation workflow manager 214 may evaluate the various parameters provided by the customer via the service frontend 204 and the system requirements for the various components of the simulation to determine what virtual computing instances are to be provisioned in order to support execution of the application 220 in the simulation environment and to generate the simulation environment. For instance, the simulation workflow manager 214 may evaluate the obtained parameters to determine the computational requirements (e.g., memory, CPU requirements, GPU requirements, etc.) for executing and supporting the simulation. For example, the simulation workflow manager 214 may identify a set of components of the simulation (e.g., physics engines, rendering engines, etc.) needed to execute the simulation and to process actions of the robotic device within the simulation environment. Based on these computational requirements, the simulation workflow manager 214 may provision a set of virtual computing instances within a set of simulation servers 216 to execute the simulation of the application 220.

In an embodiment, the simulation workflow manager 214 allocates the various components of the simulation among different virtual computing instances on the simulation servers 216 based on the system requirements of the components and the capabilities of the virtual computing instances. For example, the simulation workflow manager 214 may create, from the set of components, discretizable subsets of the simulation that may be apportioned among the virtual computing instances. The simulation workflow manager 214 may place a first set of components corresponding to a subset of the simulation within a virtual computing instance. If there is remaining capacity for additional components in the virtual computing instance, the simulation workflow manager 214 may allocate the next set of components within the same virtual computing instance. Otherwise, the simulation workflow manager 214 may allocate the next subset of the simulation on to another virtual computing instance. The simulation workflow manager 214 may continue this process until all components of the simulation have been allocated among the various virtual computing instances within the simulation servers 216.

In an embodiment, the simulation workflow manager 214 establishes, between each virtual computing instance utilized for the simulation, a network interface to enable secure communications among the various components of the simulation. The simulation workflow manager 214 may map the simulation to the customer's own virtual private network (as identified via the request) and/or to a customer's own virtual computing instances operating within an on-premises network. This ensures that resources necessary for execution of the simulation are available to the components executing the application 220 within the simulation environment. In an embodiment, the simulation workflow manager 214 maintains, within a simulation server 216, a training application container that performs training of the reinforcement learning model based on actions performed by the simulated robotic device within the simulation environment based on the state of the robotic device and simulation environment prior to and after execution of the action. The training of the reinforcement learning model may further take into account the reward value, as determined via the custom-designed reinforcement function, corresponding to the action performed, the initial state, and the state attained via execution of the action. The training application container may provide the updated reinforcement learning model to a simulation application container to utilize in the simulation of the application 220 and to obtain new state-action-reward data that may be used to continue updating the reinforcement learning model.

The simulation workflow manager 214 may monitor the virtual computing instances executing the simulation and the simulation servers 216 to ensure that the simulation is completed successfully. For instance, the simulation workflow manager 214 may measure the CPU utilization, GPU utilization, memory utilization, and the like for each virtual computing instance to determine whether there is a potential issue. The simulation workflow manager 214 may also request, from each virtual computing instances, proving messages with measures and/or statistics that may be used to detect an issue with performance of the virtual computing instances. In an embodiment, if the simulation workflow manager 214 determines that a virtual computing instance has failed, or is otherwise inoperative, the simulation workflow manager 214 may determine whether any components of the simulation are impacted by the failure. If so, the simulation workflow manager 214 may determine the system requirements for each of the impacted components and determine, based on these system requirements, if the existing set of virtual computing instances can accommodate these impacted components. If so, the simulation workflow management 214 may migrate the impacted components among the existing, operating virtual computing instances. However, if the existing set of virtual computing instances are unable to accommodate the impacted components of the simulation, the simulation workflow manager 214 may provision new virtual computing instances among the simulation servers 216 to accommodate these impacted components of the simulation. The simulation workflow manager 214 may migrate the impacted components to the new virtual computing instances and resume simulation of the application 220.

Similarly, if the simulation workflow manager 214 detects a surge in the workload of the components of the simulation, the simulation workflow manager 214 may determine whether this surge in the workload of the components of the simulation requires additional resources to ensure that the simulation is completed successfully without negatively impacting the latency between the components of the simulation. If the surge in the workload of the components of the simulation results in a determination that additional resources are needed, the simulation workflow manager 214 may determine which components need to be migrated to new virtual computing instances to ensure successful completion of the simulation. The simulation workflow manager 214 may determine the system requirements of these components and, based on these system requirements, provision new virtual computing instances capable of accommodating these components. The simulation workflow manager may migrate the identified components to the new virtual computing instances and resume simulation of the application 220.

In an embodiment, simulation data generated by the virtual computing instances via execution of the simulation is transmitted to a computing resource monitoring service where it is stored and accessed by the simulation control sub-system 206 of the simulation management service 202. The simulation control sub-system 206 may obtain the simulation data from the computing resource monitoring service and store the data in a simulation data repository 210, where it is made available to customers of the simulation management service 202. Thus, through the service frontend 204, the customer may obtain the simulation data from the simulation data repository and determine the status of the simulation and/or modify the simulation and the application 220 based on the data. In an embodiment, the simulation servers 216 provide, via one or more visualization applications, access to the simulation in real-time. This may allow customer, via the service frontend 204, to evaluate performance of the simulation during execution of the simulation.

The simulation workflow manager 214 may monitor execution of the simulation to determine whether a termination condition has been satisfied. For instance, if the maximum allowable time for execution of the simulation has elapsed, the simulation workflow manager 214 may terminate the simulation and transmit the latest version of the reinforcement learning model and the application 220 to the data object in the object-based data storage service 218. Alternatively, a termination condition may be satisfied if the maximum number of iterations for the simulation has been reached. In some instances, a termination condition may be defined by the attainment of an average reward value for the simulation through execution of actions in the simulation environment over a minimum number of iterations of the simulation. If any of these termination conditions are met, the simulation workflow manager 214 may update the application 220 based on the latest reinforcement learning model and store the application 220 and the latest reinforcement learning model in the object-based data storage service 218. Additionally, the simulation workflow manager 214 may transmit a notification to the simulation control sub-system 206 to indicate that the simulation of the application 220 has been completed.

The simulation control sub-system 206 may notify the customer, via the service frontend 204, that the simulation has been completed. The customer, through the service frontend 204, may evaluate the latest reinforcement learning model and the application 220 to determine whether to maintain the optimizations to the application 220 or to modify the application 220. Further, the customer may define new parameters and new custom-designed reinforcement functions to obtain alternative reinforcement learning models and new updates to the application 220 based on these alternative reinforcement learning models. If the customer is satisfied with the new reinforcement learning model and application 220, the customer may submit a request, via the service frontend 204, to install the application 220 on a set of robotic devices.

Figure 3:
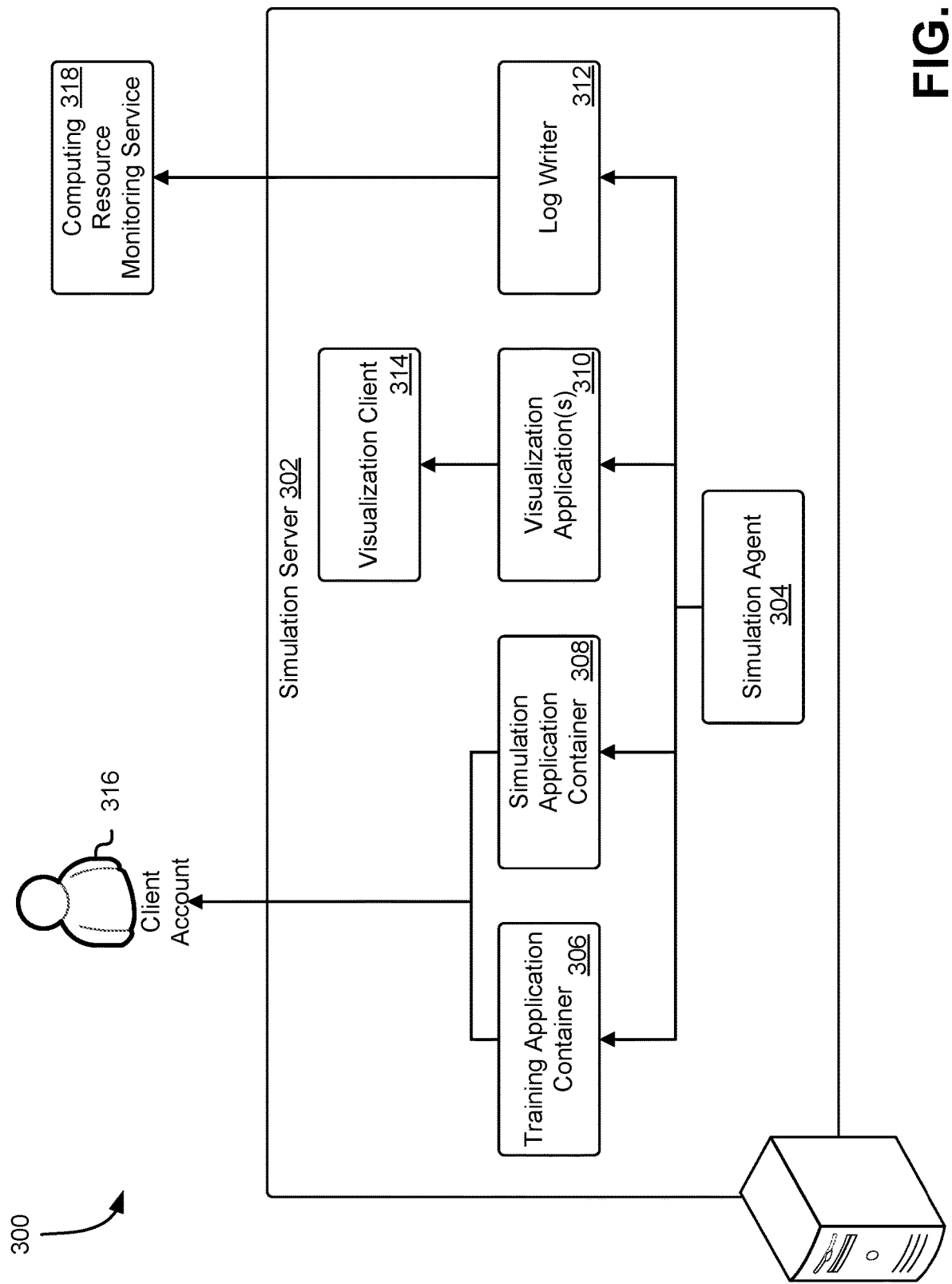
FIG. 3 shows an illustrative example of a system in which a simulation server executes a simulation of an application and processes data generated through the execution of the simulation in accordance with at least one embodiment.

FIG. 3 shows an illustrative example of a system 300 in which a simulation server 302 executes a simulation of an application and processes data generated through the execution of the simulation in accordance with at least one embodiment. In the system 300, a simulation server 302 includes a simulation agent 304 that manages the various components of a simulation and orchestrates training of a reinforcement learning model using a custom-designed reinforcement function provided by a customer of the simulation management service. The simulation agent 304 is implemented using hardware and software of the simulation server 302 or abstraction thereof (such as one or more virtual machines operating via a hypervisor) and can comprise one or more processors and memory that stores executable instructions whose execution by the one or more processors causes the computer system to perform operations described herein. In an embodiment, the simulation agent 304 is a container instance configured with a software container that includes code executable (e.g., by the resources associated with the container instance) to perform functions in accordance with techniques described herein. In an embodiment, a "container instance" refers to a computer system instance (virtual or non-virtual, such as a physical computer system running an operating system) that is configured to launch and run software containers.

The simulation agent 304 may provision a training application container 306 for execution of a training application usable to train the reinforcement learning model for the robotic device application. The robotic application container 306 may include computer-executable code that may utilize tuples or other data that specifies an initial state of a simulation environment, an action performed in response to the initial state, a resulting state of the simulation environment, and a reward value assigned to the action based on the resulting state of the simulation environment. In an embodiment, the training application of the training application container 306 may obtain this data from a memory buffer, such as a ring buffer, populated as a result of execution of actions within the simulation environment. The training application may obtain data from the memory buffer at regular intervals or in response to a triggering event (e.g., the memory buffer is near or at capacity, etc.). The training application container 306 may utilize the data as input to the training application to update the reinforcement learning model for the robotic device application being simulated. The training application container 306 may transmit the updated reinforcement learning model to a simulation application container 308, which may use the updated reinforcement learning model to perform another simulation of the robotic device application and generate more data.

The simulation agent 304 may also provision the simulation application container 308 for execution of a simulation application that generates data usable by the training application container 306 to update the reinforcement learning model. The simulation agent 304 may provide the simulation application container 308 with the robotic device application and the reinforcement function defined by the customer for execution in the simulation environment. Further, the simulation agent 304 may provide the set of parameters defined by the customer for the robotic device and for the simulation to enable the simulation application container, through a simulation application, to generate the simulation environment and execute the simulation using the robot device application and reinforcement function.

In an embodiment, the simulation application container 308 initiates the simulation using a randomized reinforcement learning model, whereby the simulation application container uses the model to select, based on an initial state of the simulation environment, a random action to be performed. The simulation application container 308 may execute the action and determine the resulting state of the simulation environment. Using the reinforcement function, the simulation application container 308 may determine the corresponding reward value for the tuple comprising the initial state, action performed, and resulting state of the simulation environment. The simulation application container 308 may store this data point in the memory buffer and execute another action based on the current state of the simulation environment. Through this process, the simulation application container 308 may continue to add data points to the memory buffer. In an embodiment, the simulation application container 308 utilizes a policy function to identify an initial state for the simulation, which may be used to select the appropriate action. Additionally, or alternatively, the simulation application container 308 may utilize a value function to select, from a set of pairings of states and actions, a pairing comprising an initial state and a corresponding action that is performable in response to the state. This may be used as input to the simulation application to cause the simulation application to perform the action.

The simulation application container 308 may obtain an updated reinforcement learning model from the training application container 306. In response to obtaining the updated reinforcement learning model, the simulation application container 308 may perform another iteration of the simulation to generate new data points usable to continue updating the reinforcement learning model. The training application container 306 may evaluate the reinforcement learning model to determine whether a termination condition has been met. For instance, if based on the data points obtained from the memory buffer, the training application container 306 determines that the reinforcement learning model has converged on an optimal solution, the training application container 306 may transmit a notification to the simulation agent 304 to indicate completion of the simulation. Similarly, the training application container 306 may determine that a termination condition has been satisfied based on the number of data points processed from the memory buffer or in response to a determination that a time limit for performance of the simulation has elapsed. The training application container 306 and the simulation application container 308 may provide simulation updates to a client account 316, which the customer may access to determine the state of the simulation.

In an embodiment, based on the simulation parameters and the system parameters, the simulation agent 304 executes one or more visualization applications 310 to allow the customer to interact and visualize the simulation as it is being performed. The one or more visualization applications 310 may generate a graphical representation of the simulation, which may include a graphical representation of the simulation environment and a graphical representation of the robotic vehicle, whose actions may be represented on the graphical representation of the simulation environment. The one or more visualization applications 310 may provide the generated graphical representations of the simulation environment and of the robotic device to a visualization client 314 of the simulation server 302. The visualization client 314 is implemented using hardware and software of the simulation server 302 or abstraction thereof (such as one or more virtual machines operating via a hypervisor) and can comprise one or more processors and memory that stores executable instructions whose execution by the one or more processors causes the computer system to perform operations described herein. The visualization client 314 may be accessed through the service frontend of the simulation management service, which may allow customers to access the visualization client 314 and view, through an interface, the graphical representation of the simulation.

The simulation agent 304 also executes a log writer 312 within the simulation server 302. The log writer 312 is implemented using hardware and software of the simulation server 302 or abstraction thereof (such as one or more virtual machines operating via a hypervisor) and can comprise one or more processors and memory that stores executable instructions whose execution by the one or more processors causes the computer system to perform operations described herein. The log writer 312 may obtain simulation data from the training application container 306 and the simulation application container 308 and utilize this simulation data to generate a set of data logs comprising metrics corresponding to the performance of the simulated robotic device in the simulation environment. The log writer 312 may transmit these data logs to a computing resource monitoring service 318, which may make the data logs available to the customer via the simulation management service.

In an embodiment, the simulation agent 304 provisions multiple simulation application containers 308 to allow performance of multiple simulations (e.g., each simulation having a different simulation environment) to provide data to the training application container 306 in order to allow performance of parallel simulations of a particular system and to train the reinforcement learning model for each of these parallel simulations. In an embodiment, the simulation application container 308 can provide simulation data to multiple training application containers 306. For instance, each training application container 306 may utilize different hyperparameters and/or different machine learning techniques to train a reinforcement learning model using the simulation data from the simulation application container 308. In an embodiment, the customer can request performance of multiple simulations to provide simulation data to multiple training application containers 306 for training various reinforcement learning models. For instance, each simulation application container 306 may provide simulation data to multiple training application containers 306 and each training application container 306 may obtain simulation data from multiple simulation application containers 308. The parameters for how many simulation applications and training applications are to be provisioned for training one or more reinforcement learning models may be provided by the customer through a user interface (such as the interfaces described below in connection with FIGS. 5-10) or through one or more APIs exposed to the customer by the simulation management service.

Figure 4:
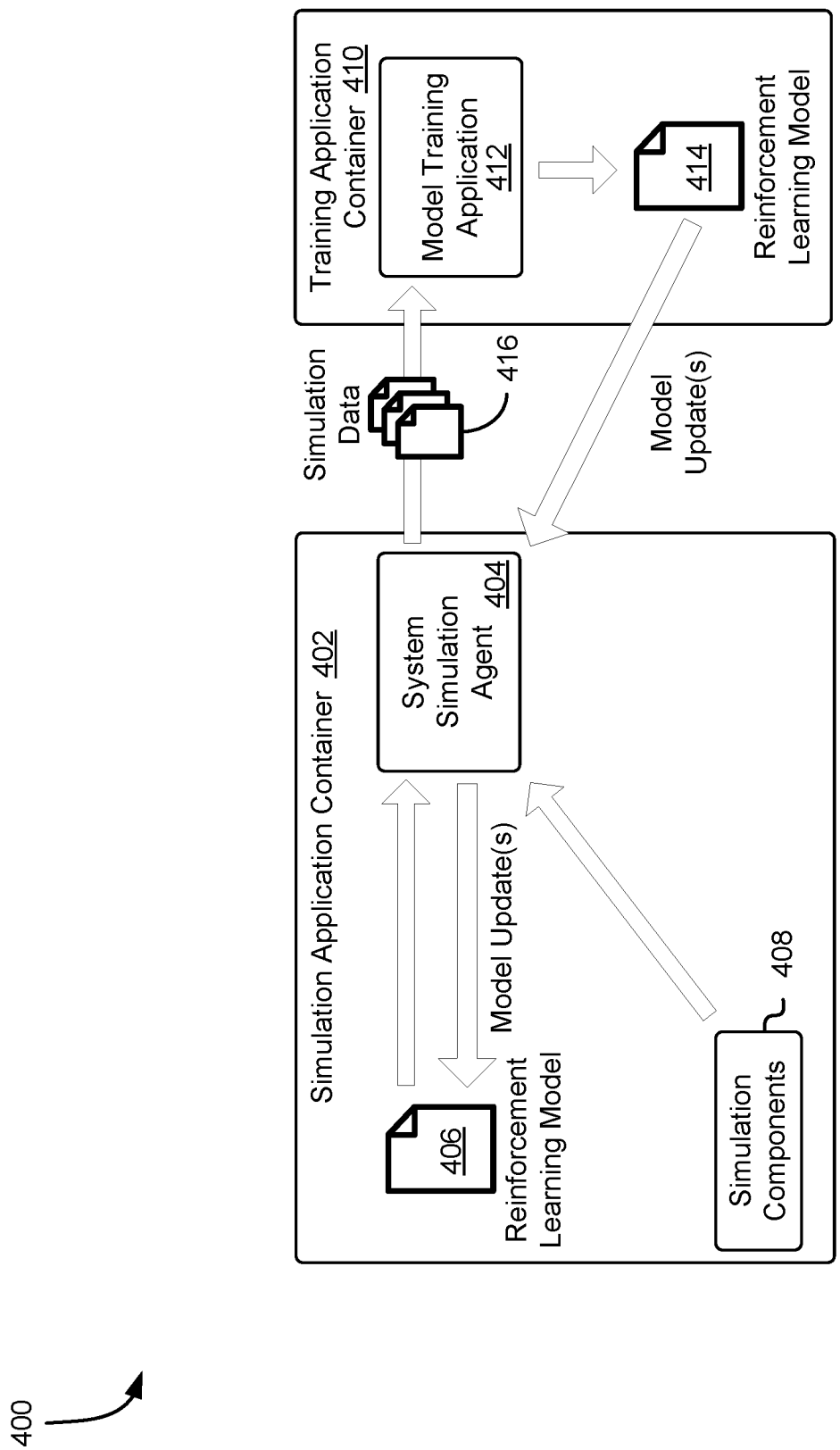
FIG. 4 shows an illustrative example of a system in which a simulation application container performs a simulation of an application using a reinforcement learning model that is updated by a training application container in accordance with at least one embodiment.

FIG. 4 shows an illustrative example of a system 400 in which a simulation application container 402 performs a simulation of an application using a reinforcement learning model 406 that is updated by a training application container 410 in accordance with at least one embodiment. In the system 400, the simulation application container 402 executes a system simulation agent 404 to initiate simulation of a robotic device application to train a reinforcement learning model 406 selected by the customer through the simulation management service. The system simulation agent 404 is implemented using hardware and software of a simulation server or abstraction thereof (such as one or more virtual machines operating via a hypervisor) and can comprise one or more processors and memory that stores executable instructions whose execution by the one or more processors causes the computer system to perform operations described herein.

In an embodiment, the system simulation agent 404 injects the reinforcement learning model 406 into the robotic device application and obtains, from a simulation components 408 datastore, the various simulation components that, if executed, are used to create the simulation environment and execute the simulation. As noted above, the simulation components 408 may include physics engines, rendering engines, and the like. If the simulation components 408 are maintained among various virtual computing instances, the system simulation agent 404 may communicate, via the various network interfaces among the virtual computing instances, with these virtual computing instances to access the requisite simulation components 408 needed to execute the simulation of the robotic device application and to train the reinforcement learning model 406.

In an embodiment, the system simulation agent 404 utilizes a value function to select, from a set of pairings of initial simulation environment states and corresponding actions, a pairing that may be used as input to the simulation application to cause the simulation application to perform the action. During the initial execution of the simulation application, the system simulation agent 404 may select this pairing at random, since the reinforcement learning model 406 has not been updated to provide sufficient guidance for selecting a pairing that would result in a higher reward value in accordance with the reinforcement function defined by the customer. In an embodiment, the system simulation agent 404 can additionally, or alternatively, utilize a policy function to identify an initial state for the simulation, which may be used to select the appropriate action to be performed within the simulation environment. Similar to the value function described above, the system simulation agent 404 may select the action to be performed at random if it is the initial action to be selected based on the initial state of the simulation environment. The action may be selected at random since the reinforcement learning model 406 has not been updated to provide the sufficient guidance for selecting an action that would result in a higher reward value in accordance with the reinforcement function.

In an embodiment, the system simulation agent 404 determines the resulting state of the simulation environment in response to performance of the selected action or pairing of initial state and action (depending on whether the policy function or value function are utilized). Using the reinforcement function, the system simulation agent 404 may determine the corresponding reward value for the tuple comprising the initial state, action performed, and resulting state of the simulation environment. The system simulation agent 404 may store this data point in a memory buffer and execute another action based on the current state of the simulation environment. Through this process, the system simulation agent 404 may continue to add data points to the memory buffer. In an embodiment, the memory buffer is a ring buffer.

A ring buffer may be a data structure that serves as a queue for processing data streams in a first-in-first-out (FIFO) manner.

The training application container 410, via a model training application 412, may access the memory buffer to obtain the simulation data 416 generated by the system simulation agent 404. The model training application 412 may utilize tuples or other data that specifies an initial state of a simulation environment, an action performed in response to the initial state, a resulting state of the simulation environment, and a reward value assigned to the action based on the resulting state of the simulation environment. In an embodiment, the model training application 412 can obtain the simulation data 416 from the memory buffer at regular intervals or in response to a triggering event (e.g., the memory buffer is near or at capacity, etc.). The model training application 412 may utilize the data as input to update the reinforcement learning model for the robotic device application being simulated, resulting in an updated reinforcement learning model 414. As the model training application 412 updates the reinforcement learning model 414, the training application container 410 may transmit the updated reinforcement learning model 414 to the simulation application container 402. This may cause the system simulation agent 404 to update its reinforcement learning model 406 and use the updated reinforcement learning model to perform another simulation of the robotic device application and generate more simulation data 416.

In an embodiment, the model training application 412 may evaluate the reinforcement learning model 414 during subsequent iterations to determine whether a termination condition has been met. For instance, if based on the simulation data 416 obtained from the memory buffer, the model training application 412 determines that the reinforcement learning model 414 has converged on an optimal solution (e.g., the average reward value over an N number of iterations is greater than a minimum threshold value, etc.) and a determination is made that the reward value is not going to improve beyond the average reward value, the model training application 412 may transmit a notification to the system simulation agent 404 to indicate completion of the simulation. While average reward values are used extensively throughout the present disclosure for the purpose of illustration, other statistics or metrics involving reward values may be used to define a termination condition (e.g., average change in the reward value over a set of previous simulation iterations is below a threshold value, etc.). Similarly, the model training application 412 may determine that a termination condition has been satisfied based on the number of data points processed from the simulation data 416 collected from the memory buffer or in response to a determination that a time limit for performance of the simulation has elapsed. The model training application 412 and the system simulation agent 404 may provide simulation updates to a client account, which the customer may access to determine the state of the simulation.

Figure 5:
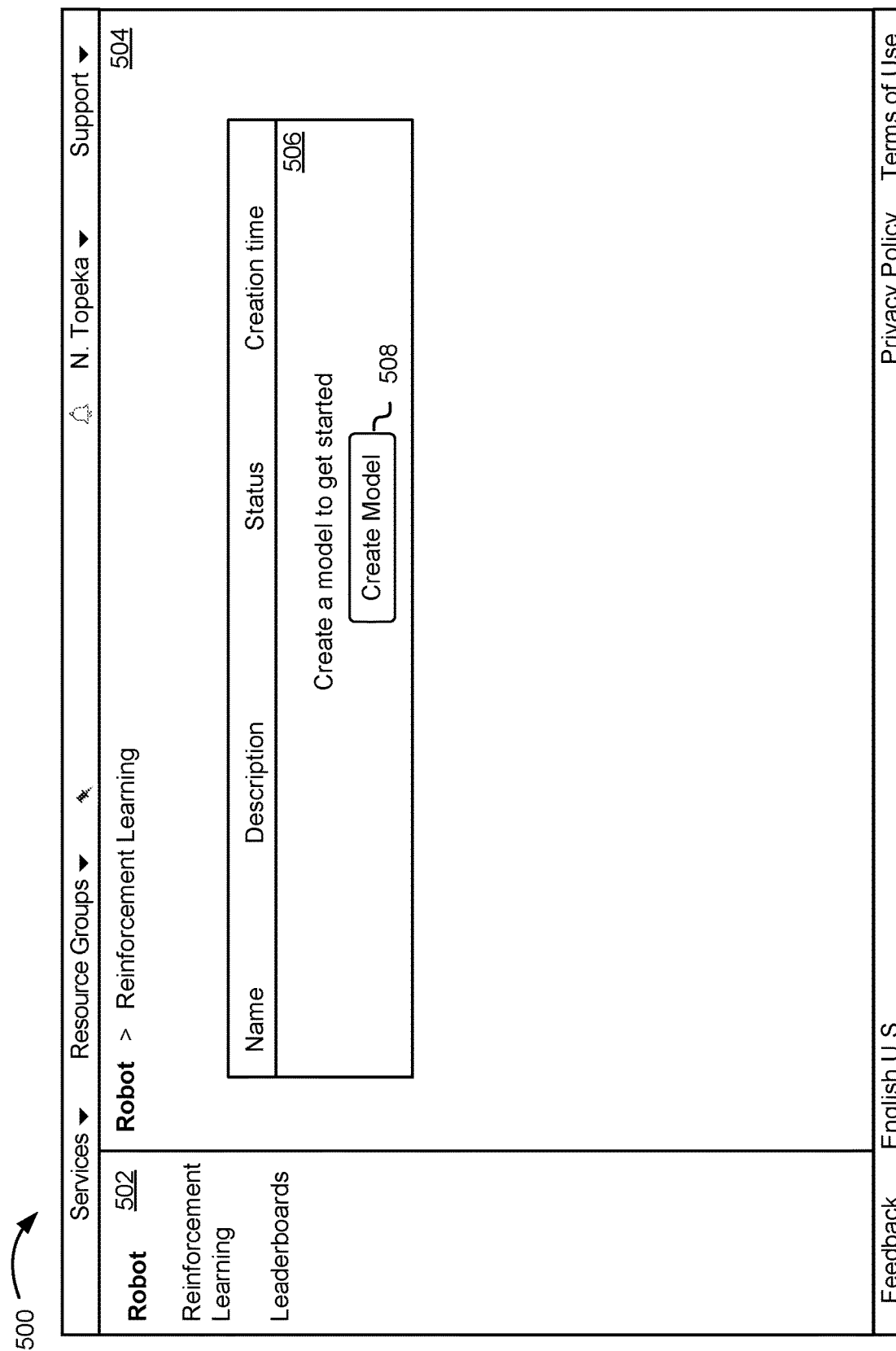
FIG. 5 shows an illustrative example of an interface for generating a reinforcement learning model for simulation of a system using an application in accordance with at least one embodiment.

FIG. 5 shows an illustrative example of an interface 500 for generating a reinforcement learning model for simulation of a system using an application in accordance with at least one embodiment. The interface 500 may include a selection panel 502 whereby a customer of the simulation management service may select, from a menu of different options, an option to create a new reinforcement learning model or an option to generate a leaderboard comprising reward values for different reinforcement learning models utilized in a particular simulation environment. In an embodiment, the simulation management service exposes one or more APIs for defining and managing a leaderboard, which may be presented via the interface 500 in response to selection of the leaderboard option in the selection panel 502. For instance, the customer may submit a CreateLeaderboard( ) API call to request creation of a new public or private leaderboard. The CreateLeaderboard( ) API call can include, as a string, a unique name for the leaderboard, a description for the leaderboard, the epoch time after which the leaderboard will be closed, the minimum number of executions to qualify for the leaderboard, whether the leaderboard is public or private, an access code if the leaderboard is private, and a resource name corresponding to the simulation environment. The customer can also submit a DeleteLeaderboard( ) API call, which may include, as a string, the unique name of the leaderboard that is to be deleted. The customer may submit, through the interface 500, a CloseLeaderboard( ) API call to close an existing leaderboard. The CloseLeaderboard( ) API call may include, as a string, the name of the leaderboard that is to be closed.

In some instances, the customer may submit, through the interface 500, a JoinLeaderboard( ) API call to join an existing public or private leaderboard. The JoinLeaderboard( ) API call may include, as a string, the name of the leaderboard that the customer wishes to join. Further, the customer may provide, as part of the string, an access code to join a private leaderboard. The customer may also submit a ListEligibleLeaderboardsForModel( ) API call to obtain an ordering of leaderboards that can accept the reinforcement learning model maintained by the customer and trained through simulation of the robotic device application. This API call may include, as a string the resource name of the reinforcement learning model, a pagination token, and the maximum number of results to be presented per interface page. In response to this API call, the simulation management service may determine which robotic device applications and simulation environments may be used for the reinforcement learning model and identify any leaderboards associated with these applications and simulation environments.

Through the interface 500, the customer may also submit a GetLeaderboard( ) API call to request leaderboard data, including high scores (e.g., reward values), reinforcement learning models utilized in the simulations associated with the leaderboard, and the like. The GetLeaderboard( ) API call may include, as a string, the name of the leaderboard for which the customer wishes to obtain data for. The customer may also submit a ListLeaderboardSubmissions( ) API call to request an ordering of the specified leaderboard submissions. The response to this API call may be returned sorted by rank. The API call may include, as a string, the name of the leaderboard, a pagination token, and the maximum number of results that are to be returned per interface page. Through the interface 500, the customer may also submit a GetUserSubmission( ) API call to obtain a user submission that is currently on the leaderboard. The GetUserSubmission( ) API may include, as a string, the name of the leaderboard for which the customer wishes to obtain the user submission. In some instances, the customer may specify the specific identifier corresponding to the user submission. The customer may also submit a ListLeaderboards( ) API call to obtain an ordering of leaderboards which the customer has access to. This API call may include, as a string, a filter for searching through the leaderboards maintained by the simulation management service, a pagination token, and a maximum number of results to be returned per interface page.

Further, the customer may provide, as a Boolean, an indication whether to return leaderboards that include a submission by the customer.

If the customer selects, from the selection panel 502, the reinforcement learning option, the customer may be presented with a reinforcement learning window 504. Through the reinforcement learning window 504, the simulation management service may present the customer with a reinforcement learning model window 506. The reinforcement learning model window 506 may provide customers with an ordering of their reinforcement learning models for a particular robotic device application. For instance, the reinforcement learning model window 506 may present, for each available model, the name of the model, a description of the model, the status of the model (e.g., converged, being updated via simulation, etc.), and the time at which the reinforcement learning model was created. In addition to providing details for every available model, the reinforcement learning model window 506 may present customers with an option to generate a new reinforcement learning model. For example, as illustrated in FIG. 5, the reinforcement learning model window 506 may include a create model button 508 that, if selected, may cause the simulation management service to update the reinforcement learning window 504 to present a customer with various options for creating the reinforcement learning model.

Figure 6:
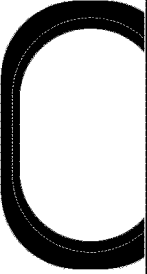
FIG. 6 shows an illustrative example of an interface for creating the simulation for a system using an application and the reinforcement learning model for optimizing the application in accordance with at least one embodiment.

FIG. 6 shows an illustrative example of an interface 600 for creating the simulation for a system using an application and the reinforcement learning model for optimizing the application in accordance with at least one embodiment. The interface 600 may share elements similar to those described above in connection with FIG. 5. For instance, the interface 600 may include a selection panel 602 similar to the selection panel 502 described above. The interface 600 may include a create model window 604, which may be presented to the customer in response to selecting the create model button 508 described above in connection with FIG. 5.

The create model window 604 may be used to present the customer with a model details window 606, through which the customer may define, through a model name entry box 608, the desired name for the simulation. Further, the customer may provide, through a model description entry box 610, a description of the simulation. In some instances, an entry in the model description entry box 610 is not required. Through the model details window 606, the customer may also define the access control policies that may be used to give the robotic device permission to perform actions in other computing resource services on behalf of the customer. Further, through the model details window 606, the customer may select or otherwise provision a data object for storage of the robotic device application, the reinforcement learning model, and other data generated through simulation of the robotic device application. The model details window 606 may present customers with a create policy and data object button 612, which the customer may select to define the access control policies and select or otherwise provision the data object to be associated with the simulation.

The create model window 604 may also be used to present the customer with an environmental simulation window 614, through which the customer may define the simulation environment for the simulation. In an embodiment, the simulation management service may provide several default simulation environments that may be used as templates by the customer to create customized simulation environments. For instance, the simulation management service may populate the environmental simulation window 614 with one or more simulation environment templates 616, which the customer may choose from. Through the interface 600, the customer may select a simulation environment from the environment templates 616 presented via the environmental simulation window 614.

If the customer selects a simulation environment template 616 from the environmental simulation window 614, the simulation management service may allow the customer to request modifications to the selected environment and to specify a set of parameters corresponding to modifications that are to be incorporated to the selected simulation environment. These parameters may include additional dynamic or stationary obstacles to the simulation environment and the placement of these obstacles within the simulation environment, changing the layout of the simulation environment, changing the dimensions of the simulation environment, and the like. In an embodiment, through the interface 600, the customer can submit a ListEnvironments( ) API call to obtain an ordering of the simulation environments available for selection. Further, through the interface 600, the customer may submit a GetEnvironment( ) API call to obtain metadata of the selected simulation environment. The GetEnvironment( ) API call may include, as a string, the resource name of the selected simulation environment. The metadata may include the parameters of the simulation environment, as described above.

Figure 7:
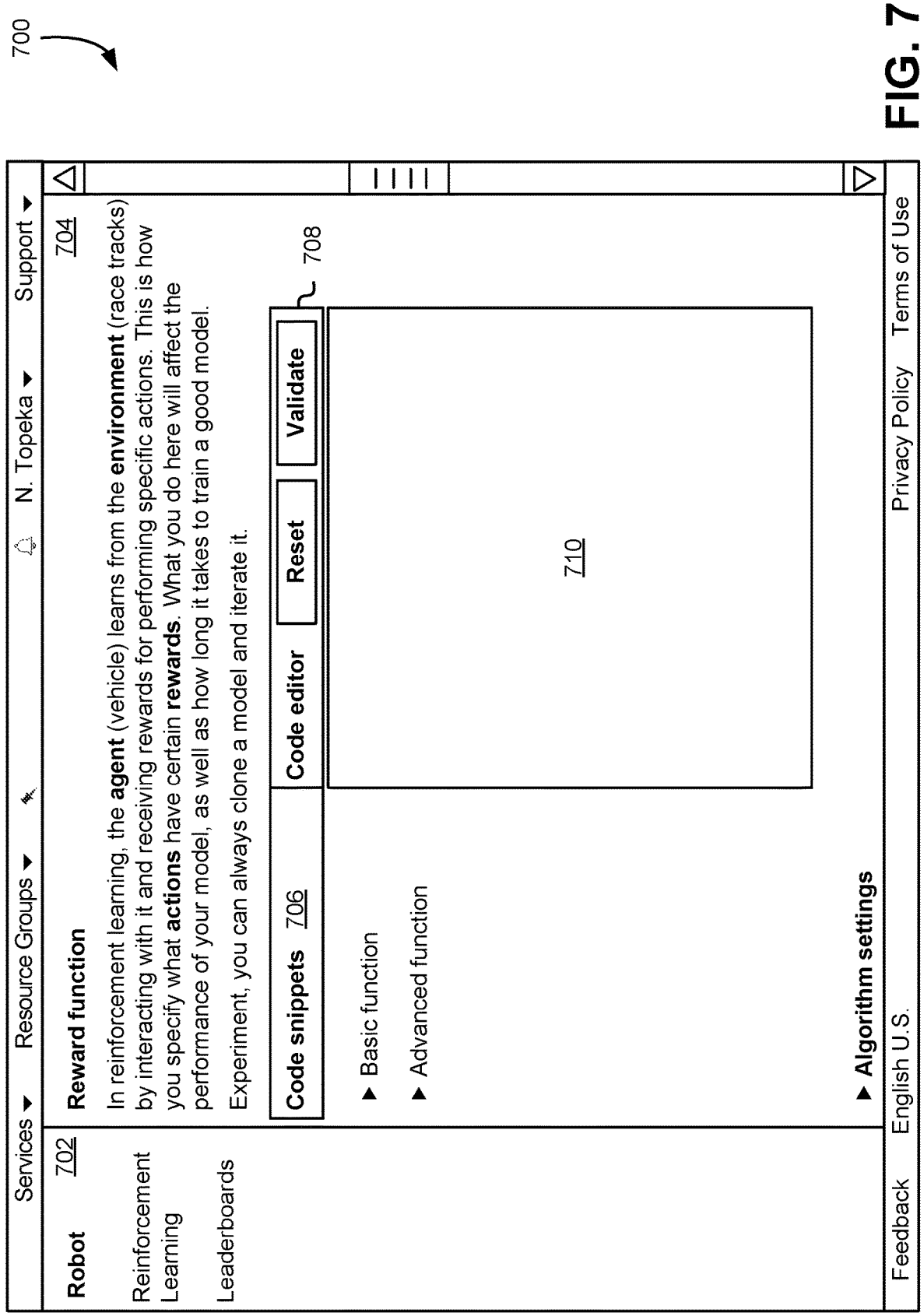
FIG. 7 shows an illustrative example of an interface for creating a custom-designed reinforcement function for training a reinforcement learning model in accordance with at least one embodiment.

FIG. 7 shows an illustrative example of an interface 700 for creating a custom-designed reinforcement function for training a reinforcement learning model in accordance with at least one embodiment. The interface 700 may include, much like the interfaces described above, a selection panel 702 whereby a customer of the simulation management service may select, from a menu of different options, an option to create a new reinforcement learning model or an option to generate leaderboard comprising reward values for different reinforcement learning models utilized in a particular simulation environment. The interface 700 may also include a reward function window 704, through which a customer may define the reinforcement function (otherwise known as a reward function) for defining reward values for actions and states of the simulation environment.

Through the reward function window 704, the simulation management service may present the customer with a code editor 710, through which the customer may define, using computer-executable code, the reinforcement learning function for training the reinforcement learning model. Through the code editor 710, the customer may generate the computer-executable code using any programmatic language (e.g., Python, C++, etc.). Once the customer has defined, through the code editor 710, the computer-executable code defining the reinforcement function, the customer may use the code editor banner 708 to either request validation of the reinforcement function or to reset the code editor. If the code editor banner 708 is used to request validation of the reinforcement function, the simulation management service may evaluate the computer-executable code to identify any errors that may prevent compilation of the computer-executable code. For instance, the simulation management service may evaluate the computer-executable code to determine whether the computer-executable code includes syntax errors, includes conflicting instructions, complies with the standards of the particular programmatic language used to generate the code (e.g., Python, C++, etc.), and the like. If, based on evaluation of the computer-executable code, the simulation management service determines that the computer-executable code can be compiled for use in the simulation, the simulation management service may validate the computer-executable code.

Further, the simulation management service may identify one or more snippets of the computer-executable code that define the reward values for a set of state-action tuples. The simulation management service may provide these snippets of code in windows associated with a code snippets banner 706 as described in further detail below. In an embodiment, the customer can submit, through the interface 700, a TestReinforcementFunction( ) API call, which can be used to test the reinforcement function defined through the code editor 710. The TestReinforcementFunction( ) API call may include, as a string, the computer-executable code provided through the code editor 710. In response to this API call, the simulation management service may provide any identified errors resulting from evaluation of the computer-executable code.

Figure 8:
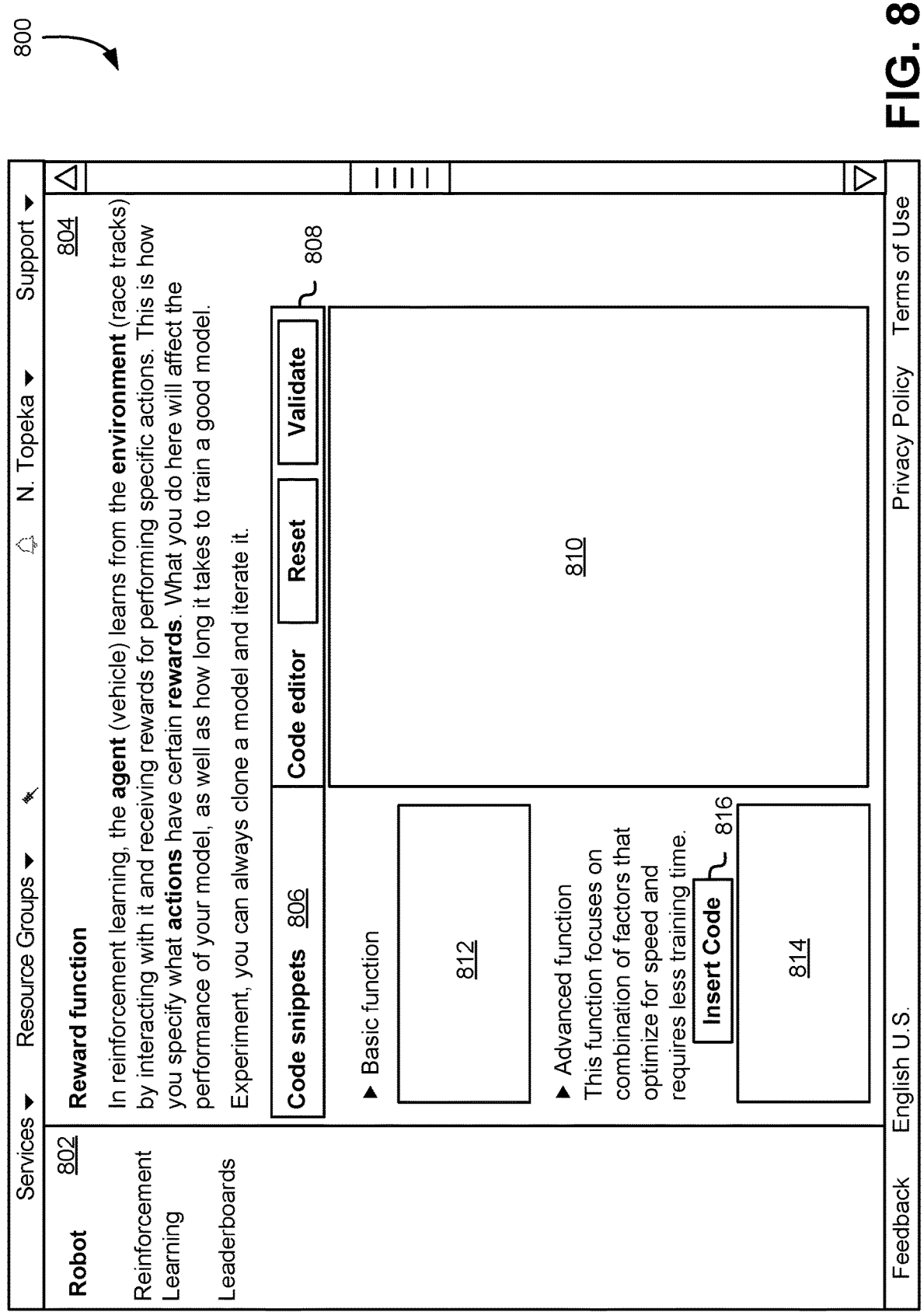
FIG. 8 shows an illustrative example of an interface for creating a custom-designed reinforcement function for training a reinforcement learning model in accordance with at least one embodiment.

FIG. 8 shows an illustrative example of an interface 800 for creating a custom-designed reinforcement function for training a reinforcement learning model in accordance with at least one embodiment. The interface 800 may be similar to the interface 700 described above in connection with FIG. 7. For instance, the interface 800 may include a selection panel 802 whereby a customer of the simulation management service may select, from a menu of different options, an option to create a new reinforcement learning model or an option to generate leaderboard comprising rewards values for different reinforcement learning models utilized in a particular simulation environment. Further, the interface 800 may include a reward function window 804 that includes a code editor 810, a code editor banner 808, and a code snippets banner 806.

As noted above, the simulation management service may evaluate the computer-executable code provided through the code editor 810 to identify functions within the code that are used to define the reinforcement function. The simulation management service may update a basic function window 812 to present the identified functions. In an embodiment, the simulation management service evaluates the computer-executable code, including the functions identified and presented through the basic function window 812, to identify a set of suggestions that may be used to enhance the reinforcement function. These suggestions may be based on historical use of the code editor 810 to generate computer-executable code for reinforcement functions applied to the selected simulation environment using similar robotic devices. These suggestions may be presented to the customer via an advanced function window 814, which may include a modified version of the functions specified in the basic function window 812.

The simulation management service may provide, through the reward function window 804, an insert code button 816. The customer may select the insert code button 816 to request insertion of the functions specified in the advanced function window into the code editor 810. This may cause the simulation management service to replace the snippet of code used to update the basic function window 812 with the snippet of code from the advanced function window 814. The customer may use the code editor banner to request validation of the reinforcement function including the snippet of code inserted from the advanced function window 814. If the reinforcement function is successfully validated and compiled by the simulation management service, the simulation management service may add the reinforcement function to the data object specified through the interface.

FIG. 9 shows an illustrative example of an interface 900 for specifying the machine learning framework for training the reinforcement learning model in accordance with at least on embodiment. The interface 900 may include similar elements as the other interfaces described above in connection with FIGS. 5-8. For instance, the interface 900 may include a selection panel 902 whereby a customer of the simulation management service may select, from a menu of different options, an option to create a new reinforcement learning model or an option to generate leaderboard comprising rewards values for different reinforcement learning models utilized in a particular simulation environment.

In an embodiment, the interface 900 includes a machine learning framework window 904, through which the customer can define the machine learning framework, an optimization algorithm, and the hyperparameters for training the reinforcement learning model. For instance, the machine learning framework window 904 may include batch size radio buttons 906 for selecting the batch size for the simulation, an epoch selection panel 908 for selecting the number of epochs for the simulation, a stack size panel 910 for selecting the stack size for the simulation, and a learning rate panel 912 for determining the learning rate for the reinforcement learning model. Additionally, the machine learning framework window 904 may include exploration radio buttons 914, through which the customer may define the exploration algorithm to be used for training the reinforcement learning model (e.g., using categorical parameters, epsilon greedy algorithms, etc.). The machine learning framework window 904 may also include an entropy selection panel 916 through which the customer may define the entropy of predicted actions to determine the training loss at the end of each epoch. Through a discount factor panel 918, the customer may also define the discount factor, which is used to determine the importance of future rewards through performance of actions in the simulation.

Figure 10:
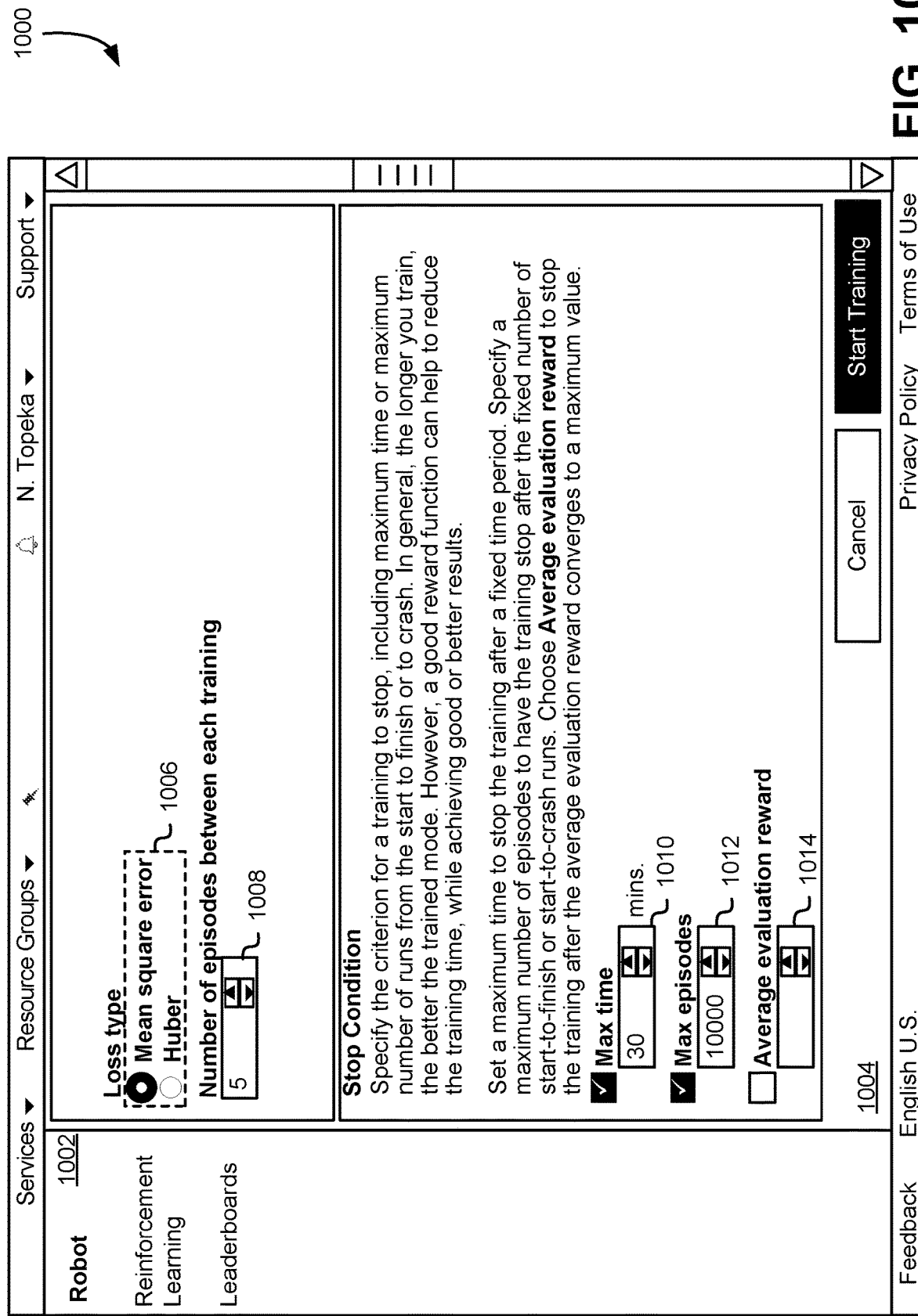
FIG. 10 shows an illustrative example of an interface for defining the termination conditions for completing training of a reinforcement learning model in accordance with at least one embodiment.

As illustrated in FIG. 10, additional options may be presented through the interface 1000 to define the machine learning framework. For instance, the interface 1000 may provide loss type radio buttons 1006, through which the customer may define the loss function for the training of the reinforcement learning model. As illustrated in FIG. 10, the customer may select from a mean squared error loss function or a Huber loss function, although other loss functions may be made available to the customer and presented via the loss type radio buttons 1006. Additionally, through the interface 1000, the customer may select the number of episodes between each training iteration through an episode selection panel 1008. It should be noted that the loss type radio buttons 1006 and the episode selection panel 1008 may be part of the machine learning framework window 904 described above in connection with FIG. 9. For instance, the customer may scroll down on the machine learning framework window 904 to access the loss type radio buttons 1006 and the episode selection panel 1008.

FIG. 10 further shows an illustrative example of an interface 1000 for defining the termination conditions for completing training of a reinforcement learning model in accordance with at least one embodiment. The interface 1000 may include the selection panel 1002 that is similarly used in the other interfaces described above in connection with FIGS. 5-9. Further, the interface 1000 may include a termination condition window 1004, through which the customer may define and select the termination conditions for terminating simulation and training of a reinforcement learning model. For instance, the termination condition window 1004 may include a maximum time panel 1010, through which the customer may define the maximum amount of time for performance of the simulation and for training the reinforcement learning model. Additionally, the termination condition window 1004 may include a maximum episodes panel 1012, through which the customer may define the maximum number of iterations to be performed before terminating the simulation. The termination condition window 1004 may further include an average evaluation reward selection panel 1014, through which the customer may define the average reward value that, if achieved through iterating through the simulation and updating the reinforcement learning model, may indicate that convergence of the model has been achieved. From these termination conditions, the customer may select which to implement for the simulation through the termination condition window 1004.

It should be noted that additional or alternative termination conditions may be presented and selected from the termination condition window 1004. For instance, the customer, through the termination condition window 1004, may define a minimum entropy value for the simulation. Thus, if the entropy value for the simulation and training of the reinforcement learning model is below this minimum entropy value, the termination condition may be satisfied and the simulation is terminated as this may indicate convergence of the reinforcement learning model. Additionally, or alternatively, the termination condition window 1004 may allow the customer to define a termination condition based on evaluation of simulations performed using the reinforcement learning model. For instance, the simulation application container or other container may utilize a second simulation application to perform an evaluation of the reinforcement learning model to determine whether convergence has been achieved. This may include a determination that, through use of the reinforcement learning model, the simulation is completed successfully over a particular number of executions of the application using the reinforcement learning model (e.g., no errors detected, a minimum reward value is achieved, etc.). If the simulation is completed successfully over at least the particular number of executions, a determination may be made that the reinforcement learning model is converged. Thus, the customer may define the particular number of executions for a particular set of executions in an evaluation required to determine convergence of the reinforcement learning model.

Figure 11:
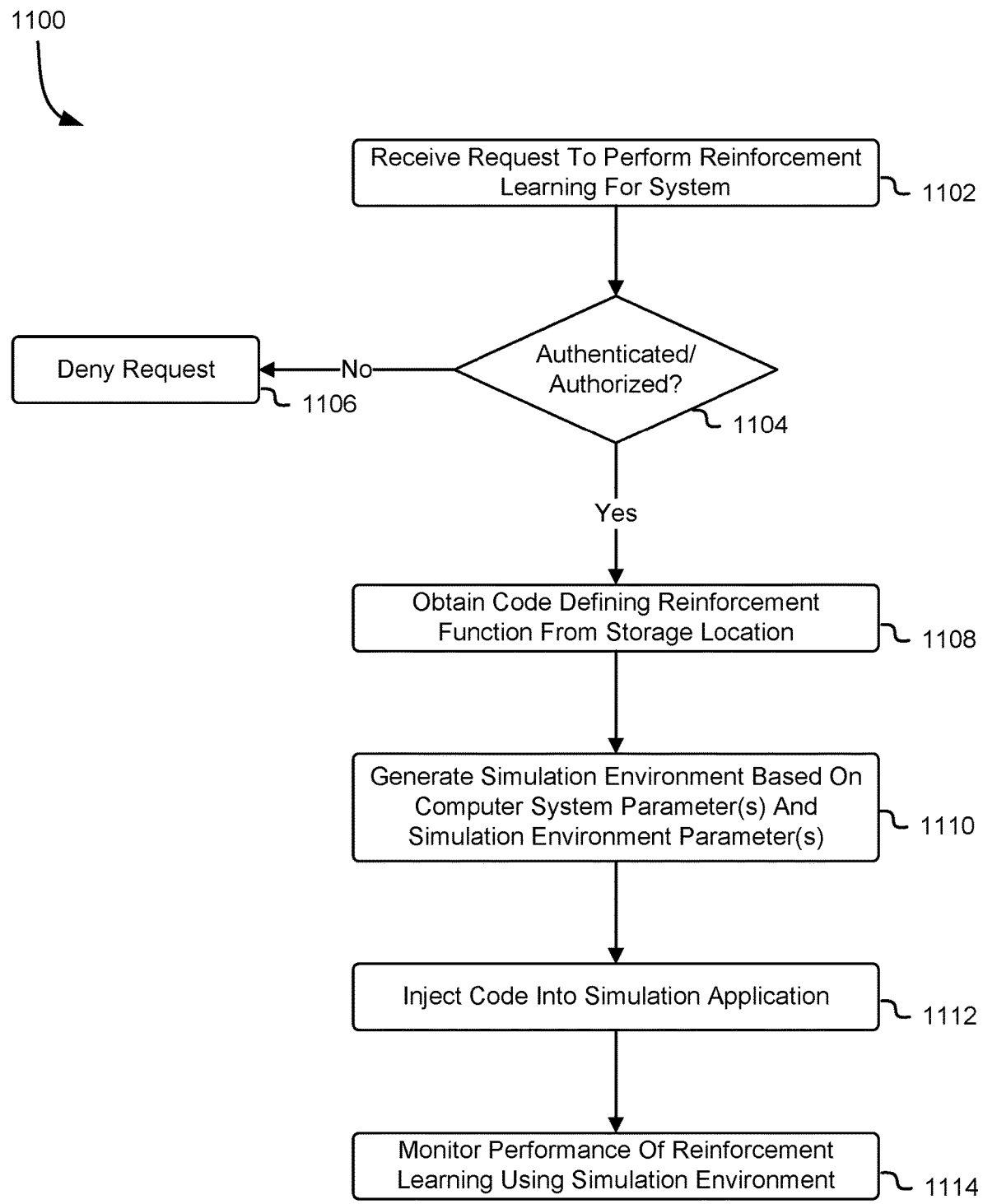
FIG. 11 shows an illustrative example of a process for performing reinforcement learning for a system in response to a request from a customer of the simulation management service in accordance with at least one embodiment.

FIG. 11 shows an illustrative example of a process 1100 for performing reinforcement learning for a system in response to a request from a customer of the simulation management service in accordance with at least one embodiment. The process 1100 may be performed by the simulation management service, which may process incoming requests to perform reinforcement learning for a particular reinforcement learning model. Further, certain operations of the process 1100 may be performed by a simulation workflow manager of a virtual computing instance management service, which may provision a set of virtual computing instances among a set of simulation servers for execution of the simulation and training of the reinforcement learning model.

In an embodiment, the simulation management service receives 1102, from a customer, a request to perform reinforcement learning for a reinforcement learning model usable to optimize a robotic device application for a robotic device. As noted above, the simulation management service may provide to the customer, via a client device of the customer, an interface through which the customer may submit the request and define a set of system parameters and simulation environment parameters. For instance, as described above in connection FIGS. 5-10, the customer may use the interface to select an existing reinforcement learning model and a location of a data object comprising the robotic device application to be tested and utilized to store simulation data generated via simulation of the robotic device application. Further, through the interface, the customer may define the machine learning framework for the simulation, as well as the termination conditions for the simulation. Through the code editor described above in connection with FIGS. 7-8, the customer may also define the custom-designed reinforcement function that is to be used to define the various reward values for training the reinforcement learning model specified in the request.

In response to the request, the simulation management service may determine 1104 whether the customer can be authenticated and, if so, whether the customer is authorized to submit such a request. If the customer cannot be authenticated or is otherwise not authorized to submit this request, the simulation management service may deny 1106 the request. However, if the customer is successfully authenticated and is authorized to submit the request, the simulation management service may obtain 1108 the computer-executable code that defines the reinforcement function. For instance, the request from the customer may specify a resource name corresponding to the reinforcement function. Using this resource name, the simulation management service may identify a storage location (e.g., data object maintained by the object-based data storage service, etc.) where the computer-executable code is stored. From this storage location, the simulation management service may obtain the computer-executable code. Alternatively, in an embodiment, the request can include the computer-executable code itself. This may obviate the need to access a storage location to obtain the code, as the code may be provided directly from the code editor.

As noted above, the simulation management service may provide the request and parameters to a simulation workflow manager of a virtual computing system management service for execution of the simulation. The simulation workflow manager, in an embodiment, uses the set of parameters identified by the customer to generate 1110 the simulation environment. For instance, the simulation workflow manager may evaluate the obtained parameters to determine the computational requirements (e.g., memory, CPU requirements, GPU requirements, etc.) for executing and supporting the simulation. Further, the simulation workflow manager may identify a set of components of the simulation (e.g., physics engines, rendering engines, etc.) needed to execute the simulation and to process actions of the system within the simulation environment. The simulation workflow manager, through a simulation application container, may inject 1112 the computer-executable code defining the reinforcement function into the application and initiate the simulation of the application and training of the reinforcement learning model through use of the simulation application container and the training application container, as described above.

In an embodiment, the simulation workflow manager monitors 1114 performance of the reinforcement learning used to train the reinforcement learning model using the particular simulation environment. For instance, the simulation workflow manager may determine whether a termination condition has been met, which may result in termination of the simulation and completion of the training of the reinforcement learning model. Further, the simulation workflow manager may determine, based on metrics data provided by the containers, whether there are any issues with the simulation that may impact the training of the reinforcement learning model. If an issue is detected, the simulation workflow manager may provision new containers to continue the simulation and training of the reinforcement learning model while minimizing the impact of the issue.

Figure 12:
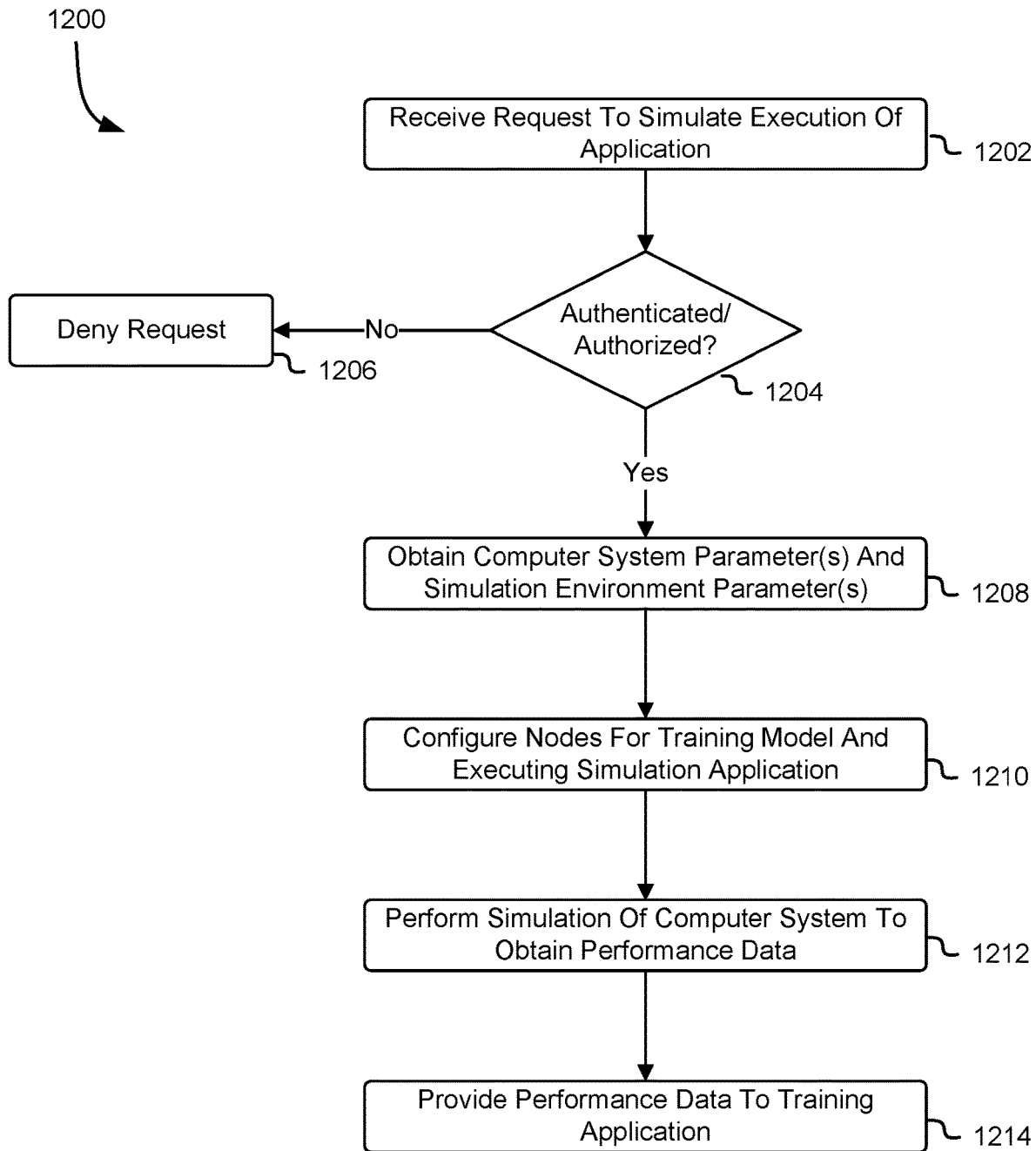
FIG. 12 shows an illustrative example of a process for initiating training of a reinforcement learning model in response to a request to simulate execution of an application in accordance with at least one embodiment.

FIG. 12 shows an illustrative example of a process 1200 for performing a simulation of an application and providing simulation data resulting from execution of the simulation in accordance with at least one embodiment. The process 1200 may be performed by the simulation management service in coordination with the simulation workflow manager 214 described above in connection with FIG. 2. For instance, the simulation workflow manager may execute the simulation while the simulation management service may perform other operations as described below to define the simulation environment and obtain simulation data generated through execution of the simulation.

In an embodiment, the simulation management service receives 1202, from a customer, a request to simulate execution of the application. As noted above, the simulation management service may provide to the customer, via a client device of the customer, an interface through which the customer may submit the request and define a set of system parameters and simulation environment parameters. For instance, as described above in connection FIGS. 5-10, the customer may use the interface to select an existing reinforcement learning model and a location of a data object comprising the application to be tested and utilized to store simulation data generated via simulation of the application. Further, through the interface, the customer may define the machine learning framework for the simulation, as well as the termination conditions for the simulation.

In response to the request, the simulation management service may determine 1204 whether the customer can be authenticated and, if so, whether the customer is authorized to submit such a request. If the customer cannot be authenticated or is otherwise not authorized to submit this request, the simulation management service may deny 1206 the request. However, if the customer is successfully authenticated and is authorized to submit the request, the simulation management service may obtain 1208 the system parameters and the simulation environment parameters for generating the simulation environment and executing the simulation. These parameters may be included in the request from the customer, such as through use of the interface described above in connection with FIGS. 5-10. Alternatively, the customer may define, through the interface, a data object or other storage location of these parameters. The simulation management service may access the data object or other storage location to obtain 1208 the parameters.

As noted above, the simulation management service may provide the request and parameters to a simulation workflow manager of a virtual computing system management service for execution of the simulation. In an embodiment, based on these parameters, the simulation workflow manager configures 1210 a set of nodes (e.g., software containers) for training a reinforcement learning model and executing the simulation application. For instance, the simulation workflow manager may provision a training application container for execution of a training application usable to train the reinforcement learning model for the application. The robotic application container may include computer-executable code that may utilize tuples or other data that specifies an initial state of a simulation environment, an action performed in response to the initial state, a resulting state of the simulation environment, and a reward value assigned to the action based on the resulting state of the simulation environment. Further, the simulation workflow manager may provision the simulation application container for execution of a simulation application that generates data usable by the training application container to update the reinforcement learning model. The simulation workflow manager may provide the simulation application container with the application and the reinforcement function defined by the customer for execution in the simulation environment. Further, the simulation workflow manager may provide the set of parameters defined by the customer for the system and for the simulation to enable the simulation application container, through a simulation application, to generate the simulation environment and execute the simulation using the robot device application and reinforcement function.

The simulation application container may execute the simulation application to perform 1212 a simulation of the system in the simulation environment and obtain performance data usable to update the reinforcement learning model. For instance, the simulation application container may initiate the simulation using a randomized reinforcement learning model, whereby the simulation application container uses the model to select, based on an initial state of the simulation environment, a random action to be performed. The simulation application container may execute the action and determine the resulting state of the simulation environment. Using the reinforcement function, the simulation application container may determine the corresponding reward value for the tuple comprising the initial state, action performed, and resulting state of the simulation environment. The simulation application container may store this data point in the memory buffer to provide 1214 the performance data to the training application and execute another action based on the current state of the simulation environment. Through this process, the simulation application container may continue to add data points to the memory buffer.

Figure 13:
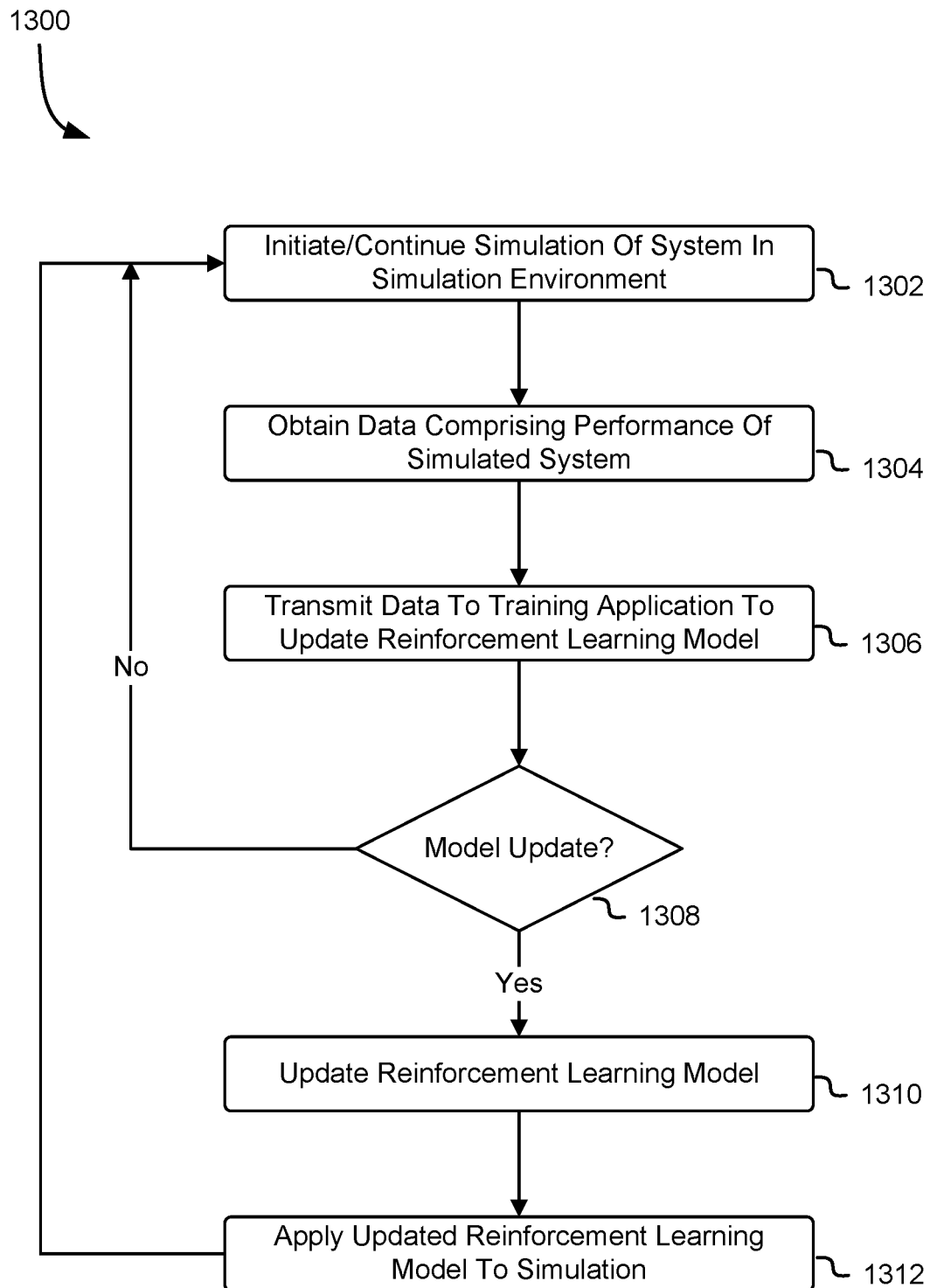
FIG. 13 shows an illustrative example of a process for updating a reinforcement learning model based on updates provided by a training application container performing training of the reinforcement learning model in accordance with at least one embodiment.

As noted above, the simulation application container may execute a simulation application to perform a simulation of a system and to generate data usable by a training application as input to update a reinforcement learning model. Further, the simulation application container may obtain an updated reinforcement learning model from the training application container, which the simulation application container may use as input to identify new actions to be performed based on the state of the simulation environment. Accordingly, FIG. 13 shows an illustrative example of a process 1300 for updating a reinforcement learning model based on updates provided by a training application container performing training of the reinforcement learning model in accordance with at least one embodiment. The process 1300 may be performed by the aforementioned simulation application container.

In an embodiment, the simulation application container initiates 1302 the simulation of the system in the simulation environment. The simulation application container may use a randomized reinforcement learning model, whereby the simulation application container uses the model to select, based on an initial state of the simulation environment, a random action to be performed. The simulation application container may execute the action and determine the resulting state of the simulation environment. Using the reinforcement function, the simulation application container may determine the corresponding reward value for the tuple comprising the initial state, action performed, and resulting state of the simulation environment. In this manner, the simulation application container may obtain 1304 data that indicates the performance of the simulated system.

The simulation application container may transmit 1306 this data point for storage in the memory buffer and execute another action based on the current state of the simulation environment. Through this process, the simulation application container may continue to add data points to the memory buffer. In an embodiment, the simulation application container utilizes a policy function to identify an initial state for the simulation, which may be used to select the appropriate action. Additionally, or alternatively, the simulation application container may utilize a value function to select, from a set of pairings of states and actions, a pairing comprising an initial state and a corresponding action that is performable in response to the state. This may be used as input to the simulation application to cause the simulation application to perform the action.

The simulation application container may determine 1308 whether an updated reinforcement learning model is available to be used as input to the simulation application to determine actions performable to obtain additional data points for training the reinforcement learning model. If an updated reinforcement learning model is not available (e.g., the simulation application container has not obtained an updated model from the training application container), the simulation application container may continue 1302 simulation of the system in the simulation environment using the existing reinforcement learning model. However, if an update is available, the simulation application container may obtain the updated reinforcement learning model from the training application container. In response to obtaining the updated reinforcement learning model, the simulation application container may update 1310 its reinforcement learning model and apply 1312 the updated model to perform another iteration of the simulation to generate new data points usable to continue updating the reinforcement learning model.

Figure 14:
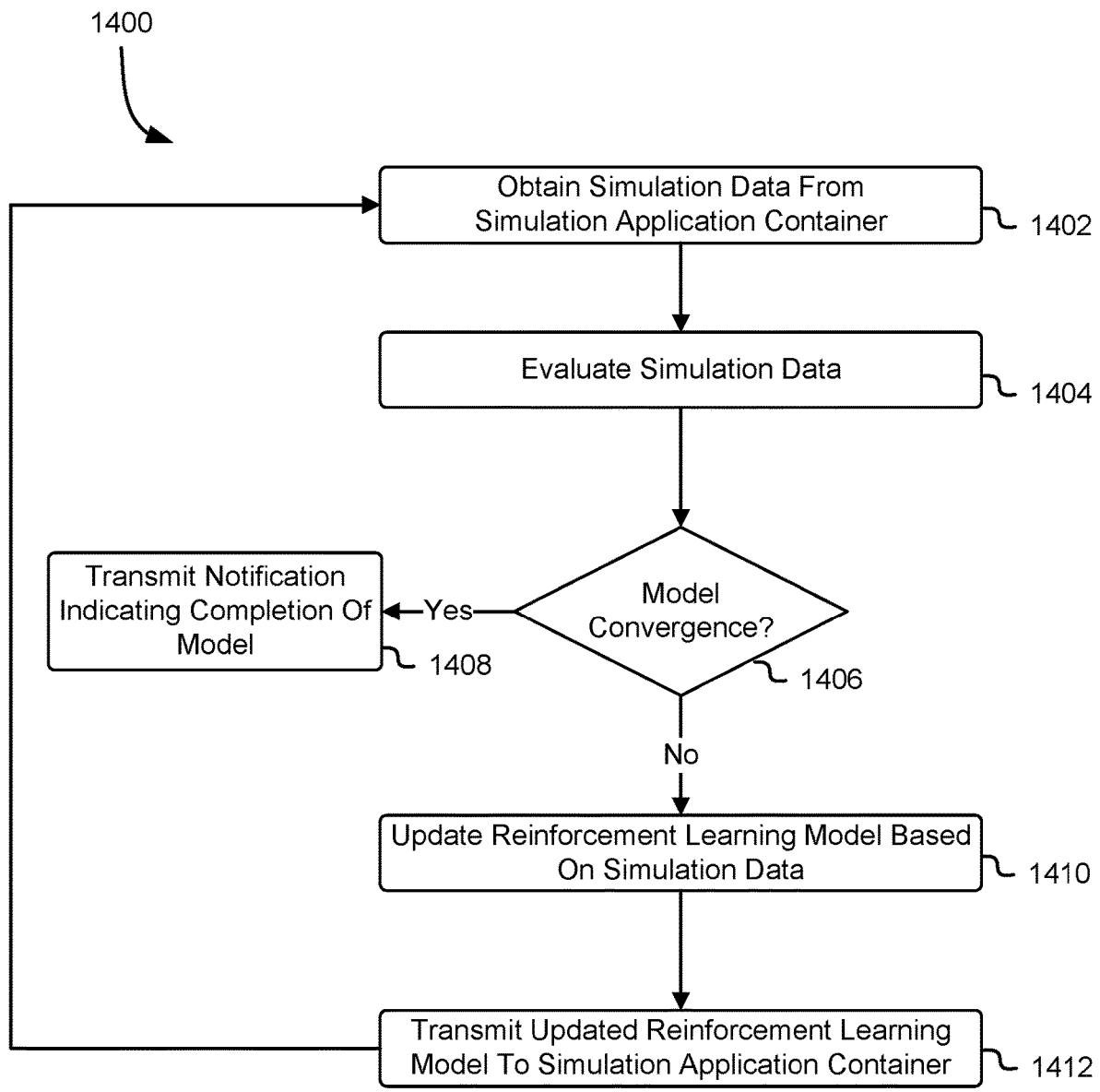
FIG. 14 shows an illustrative example of a process for updating a reinforcement training model based on simulation data from a simulation application container in accordance with at least one embodiment.

In an embodiment, the training application container evaluates, during execution of the simulation application, the reinforcement learning model to identify any modifications to be applied to the reinforcement learning model based on the output of the simulation application (e.g., the data points obtained from the memory buffer). This output may be used by a training application of the training application container to train a reinforcement learning model usable to optimize a application during execution of the simulation application within the simulation application container. Accordingly, FIG. 14 shows an illustrative example of a process 1400 for updating a reinforcement training model based on simulation data from a simulation application container in accordance with at least one embodiment. The process 1400 may be performed by the aforementioned training application container, which may execute a training application for training a reinforcement learning model.

As noted above, the simulation agent of a simulation server may provision a training application container for execution of a training application usable to train the reinforcement learning model for the application. The robotic application container may include computer-executable code that may utilize tuples or other data that specifies an initial state of a simulation environment, an action performed in response to the initial state, a resulting state of the simulation environment, and a reward value assigned to the action based on the resulting state of the simulation environment. In an embodiment, the training application of the training application container may obtain 1402 this data from a memory buffer, such as a ring buffer, populated as a result of execution of actions within the simulation environment. The training application may obtain data from the memory buffer at regular intervals or in response to a triggering event (e.g., the memory buffer is near or at capacity, etc.).

The training application container may evaluate 1404 the simulation data obtained from the memory buffer to determine whether there is convergence of the reinforcement learning model. For instance, the training application container may determine whether an average reward value for the simulation through execution of actions in the simulation environment over a minimum number of iterations of the simulation has been attained that is greater than a minimum threshold value for determining convergence of the reinforcement learning model. If the training application container determines that the reinforcement learning model is converged, the training application container may transmit 1408 a notification to the simulation workflow manager or to the simulation management service to indicate that training of the reinforcement learning model has been completed.

If the reinforcement learning model is not converged, the training application container may utilize the data from the memory buffer as input to the training application to update 1410 the reinforcement learning model for the application being simulated. The training application container may transmit 1412 the updated reinforcement learning model to a simulation application container, which may use the updated reinforcement learning model to perform another simulation of the application and generate more data. The training application container may continue to obtain 1402, from the memory buffer, the simulation data to determine whether the reinforcement learning model has converged. If not, the training application container may continue to update the reinforcement learning model until another termination condition is met (e.g., timeout period has been reached, maximum number of iterations have been performed, etc.).

Figure 15:
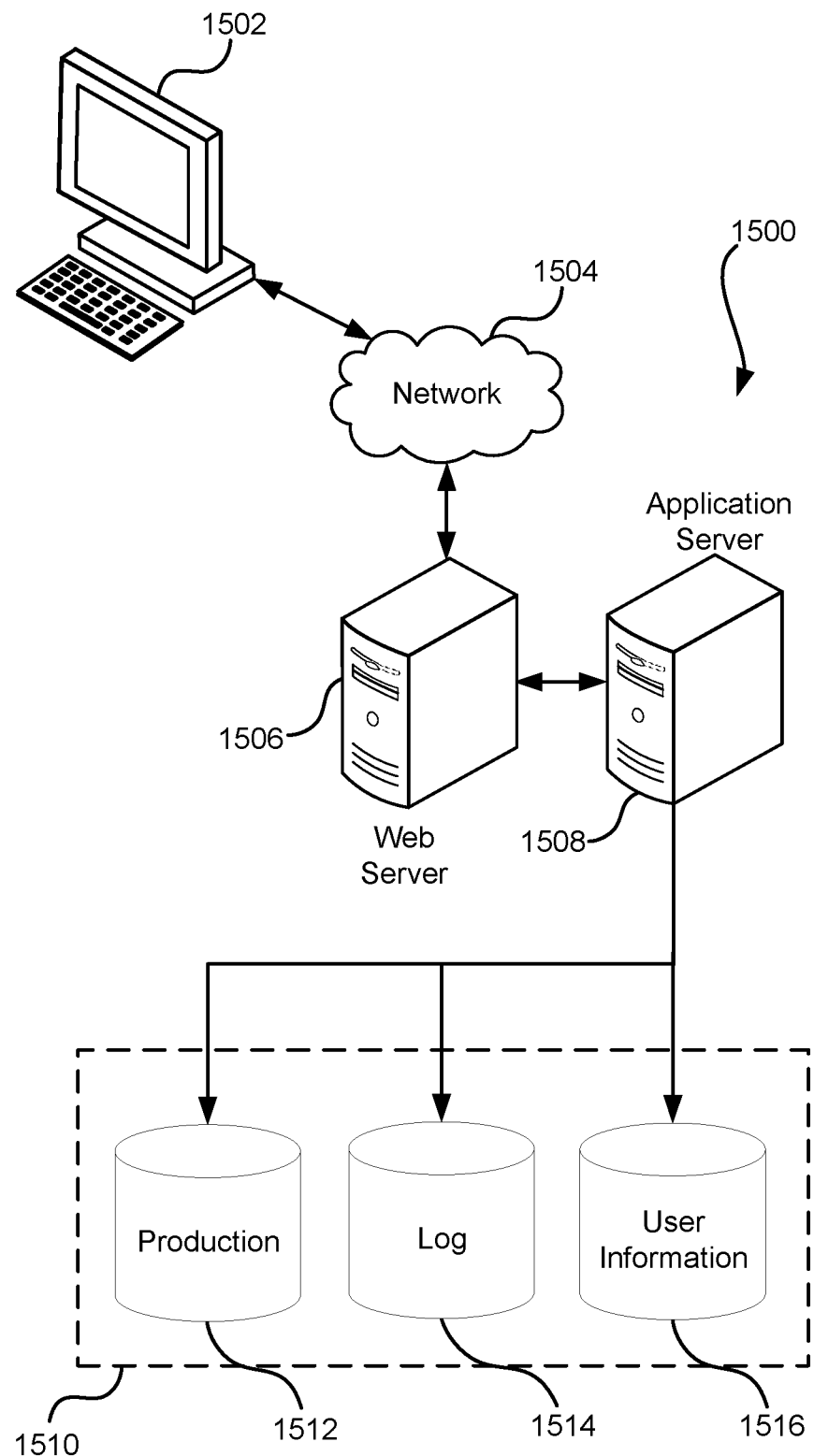
FIG. 15 illustrates a system in which various embodiments can be implemented.

FIG. 15 illustrates aspects of an example system 1500 for implementing aspects in accordance with an embodiment. As will be appreciated, although a web-based system is used for purposes of explanation, different systems may be used, as appropriate, to implement various embodiments. In an embodiment, the system includes an electronic client device 1502, which includes any appropriate device operable to send and/or receive requests, messages, or information over an appropriate network 1504 and convey information back to a user of the device. Examples of such client devices include personal computers, cellular or other mobile phones, handheld messaging devices, laptop computers, tablet computers, set-top boxes, personal data assistants, embedded computer systems, electronic book readers, and the like. In an embodiment, the network includes any appropriate network, including an intranet, the Internet, a cellular network, a local area network, a satellite network or any other such network and/or combination thereof, and components used for such a system depend at least in part upon the type of network and/or system selected. Many protocols and components for communicating via such a network are well known and will not be discussed herein in detail. In an embodiment, communication over the network is enabled by wired and/or wireless connections and combinations thereof. In an embodiment, the network includes the Internet and/or other publicly addressable communications network, as the system includes a web server 1506 for receiving requests and serving content in response thereto, although for other networks an alternative device serving a similar purpose could be used as would be apparent to one of ordinary skill in the art.

In an embodiment, the illustrative system includes at least one application server 1508 and a data store 1510, and it should be understood that there can be several application servers, layers or other elements, processes or components, which may be chained or otherwise configured, which can interact to perform tasks such as obtaining data from an appropriate data store. Servers, in an embodiment, are implemented as hardware devices, virtual computer systems, programming modules being executed on a computer system, and/or other devices configured with hardware and/or software to receive and respond to communications (e.g., web service application programming interface (API) requests) over a network. As used herein, unless otherwise stated or clear from context, the term "data store" refers to any device or combination of devices capable of storing, accessing and retrieving data, which may include any combination and number of data servers, databases, data storage devices and data storage media, in any standard, distributed, virtual or clustered system. Data stores, in an embodiment, communicate with block-level and/or object-level interfaces. The application server can include any appropriate hardware, software and firmware for integrating with the data store as needed to execute aspects of one or more applications for the client device, handling some or all of the data access and business logic for an application.

In an embodiment, the application server provides access control services in cooperation with the data store and generates content including but not limited to text, graphics, audio, video and/or other content that is provided to a user associated with the client device by the web server in the form of HyperText Markup Language ("HTML"), Extensible Markup Language ("XML"), JavaScript, Cascading Style Sheets ("CSS"), JavaScript Object Notation (JSON), and/or another appropriate client-side or other structured language. Content transferred to a client device, in an embodiment, is processed by the client device to provide the content in one or more forms including but not limited to forms that are perceptible to the user audibly, visually and/or through other senses. The handling of all requests and responses, as well as the delivery of content between the client device 1502 and the application server 1508, in an embodiment, is handled by the web server using PHP: Hypertext Preprocessor ("PHP"), Python, Ruby, Perl, Java, HTML, XML, JSON, and/or another appropriate server-side structured language in this example. In an embodiment, operations described herein as being performed by a single device are performed collectively by multiple devices that form a distributed and/or virtual system.

The data store 1510, in an embodiment, includes several separate data tables, databases, data documents, dynamic data storage schemes and/or other data storage mechanisms and media for storing data relating to a particular aspect of the present disclosure. In an embodiment, the data store illustrated includes mechanisms for storing production data 1512 and user information 1516, which are used to serve content for the production side. The data store also is shown to include a mechanism for storing log data 1514, which is used, in an embodiment, for reporting, computing resource management, analysis or other such purposes. In an embodiment, other aspects such as page image information and access rights information (e.g., access control policies or other encodings of permissions) are stored in the data store in any of the above listed mechanisms as appropriate or in additional mechanisms in the data store 1510.

The data store 1510, in an embodiment, is operable, through logic associated therewith, to receive instructions from the application server 1508 and obtain, update or otherwise process data in response thereto, and the application server 1508 provides static, dynamic, or a combination of static and dynamic data in response to the received instructions. In an embodiment, dynamic data, such as data used in web logs (blogs), shopping applications, news services, and other such applications, are generated by server-side structured languages as described herein or are provided by a content management system ("CMS") operating on or under the control of the application server. In an embodiment, a user, through a device operated by the user, submits a search request for a certain type of item. In this example, the data store accesses the user information to verify the identity of the user, accesses the catalog detail information to obtain information about items of that type, and returns the information to the user, such as in a results listing on a web page that the user views via a browser on the user device 1502. Continuing with example, information for a particular item of interest is viewed in a dedicated page or window of the browser. It should be noted, however, that embodiments of the present disclosure are not necessarily limited to the context of web pages but are more generally applicable to processing requests in general, where the requests are not necessarily requests for content. Example requests include requests to manage and/or interact with computing resources hosted by the system 1500 and/or another system, such as for launching, terminating, deleting, modifying, reading, and/or otherwise accessing such computing resources.

In an embodiment, each server typically includes an operating system that provides executable program instructions for the general administration and operation of that server and includes a computer-readable storage medium (e.g., a hard disk, random access memory, read only memory, etc.) storing instructions that, if executed by a processor of the server, cause or otherwise allow the server to perform its intended functions (e.g., the functions are performed as a result of one or more processors of the server executing instructions stored on a computer-readable storage medium).

The system 1500, in an embodiment, is a distributed and/or virtual computing system utilizing several computer systems and components that are interconnected via communication links (e.g., transmission control protocol (TCP) connections and/or transport layer security (TLS) or other cryptographically protected communication sessions), using one or more computer networks or direct connections. However, it will be appreciated by those of ordinary skill in the art that such a system could operate in a system having fewer or a greater number of components than are illustrated in FIG. 15. Thus, the depiction of the system 1500 in FIG. 15 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. In an embodiment, user or client devices include any of a number of computers, such as desktop, laptop or tablet computers running a standard operating system, as well as cellular (mobile), wireless and handheld devices running mobile software and capable of supporting a number of networking and messaging protocols, and such a system also includes a number of workstations running any of a variety of commercially available operating systems and other known applications for purposes such as development and database management. In an embodiment, these devices also include other electronic devices, such as dummy terminals, thin-clients, gaming systems and other devices capable of communicating via a network, and virtual devices such as virtual machines, hypervisors, software containers utilizing operating-system level virtualization and other virtual devices or non-virtual devices supporting virtualization capable of communicating via a network.

In an embodiment, a system utilizes at least one network that would be familiar to those skilled in the art for supporting communications using any of a variety of commercially available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and other protocols. The network, in an embodiment, is a local area network, a wide-area network, a virtual private network, the Internet, an intranet, an extranet, a public switched telephone network, an infrared network, a wireless network, a satellite network, and any combination thereof. In an embodiment, a connection-oriented protocol is used to communicate between network endpoints such that the connection-oriented protocol (sometimes called a connection-based protocol) is capable of transmitting data in an ordered stream. In an embodiment, a connection-oriented protocol can be reliable or unreliable. For example, the TCP protocol is a reliable connection-oriented protocol. Asynchronous Transfer Mode ("ATM") and Frame Relay are unreliable connection-oriented protocols. Connection-oriented protocols are in contrast to packet-oriented protocols such as UDP that transmit packets without a guaranteed ordering.

In an embodiment, the system utilizes a web server that runs one or more of a variety of server or mid-tier applications, including Hypertext Transfer Protocol ("HTTP") servers, FTP servers, Common Gateway Interface ("CGP") servers, data servers, Java servers, Apache servers, and business application servers. In an embodiment, the one or more servers are also capable of executing programs or scripts in response to requests from user devices, such as by executing one or more web applications that are implemented as one or more scripts or programs written in any programming language, such as Java®, C, C# or C++, or any scripting language, such as Ruby, PHP, Perl, Python or TCL, as well as combinations thereof. In an embodiment, the one or more servers also include database servers, including without limitation those commercially available from Oracle®, Microsoft®, Sybase®, and IBM® as well as open-source servers such as MySQL, Postgres, SQLite, MongoDB, and any other server capable of storing, retrieving, and accessing structured or unstructured data. In an embodiment, a database server includes table-based servers, document-based servers, unstructured servers, relational servers, non-relational servers, or combinations of these and/or other database servers.

In an embodiment, the system includes a variety of data stores and other memory and storage media as discussed above which can reside in a variety of locations, such as on a storage medium local to (and/or resident in) one or more of the computers or remote from any or all of the computers across the network. In an embodiment, the information resides in a storage-area network ("SAN") familiar to those skilled in the art and, similarly, any necessary files for performing the functions attributed to the computers, servers or other network devices are stored locally and/or remotely, as appropriate. In an embodiment where a system includes computerized devices, each such device can include hardware elements that are electrically coupled via a bus, the elements including, for example, at least one central processing unit ("CPU" or "processor"), at least one input device (e.g., a mouse, keyboard, controller, touch screen, or keypad), at least one output device (e.g., a display device, printer, or speaker), at least one storage device such as disk drives, optical storage devices, and solid-state storage devices such as random access memory ("RAM") or read-only memory ("ROM"), as well as removable media devices, memory cards, flash cards, etc., and various combinations thereof.

In an embodiment, such a device also includes a computer-readable storage media reader, a communications device (e.g., a modem, a network card (wireless or wired), an infrared communication device, etc.), and working memory as described above where the computer-readable storage media reader is connected with, or configured to receive, a computer-readable storage medium, representing remote, local, fixed, and/or removable storage devices as well as storage media for temporarily and/or more permanently containing, storing, transmitting, and retrieving computer-readable information. In an embodiment, the system and various devices also typically include a number of software applications, modules, services, or other elements located within at least one working memory device, including an operating system and application programs, such as a client application or web browser. In an embodiment, customized hardware is used and/or particular elements are implemented in hardware, software (including portable software, such as applets), or both. In an embodiment, connections to other computing devices such as network input/output devices are employed.

In an embodiment, storage media and computer readable media for containing code, or portions of code, include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed but, on the contrary, the intention is to cover all modifications, alternative constructions, and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. Similarly, use of the term "or" is to be construed to mean "and/or" unless contradicted explicitly or by context. The terms "comprising," "having," "including," and "containing" are to be construed as open-ended terms (i.e., meaning "including, but not limited to,") unless otherwise noted. The term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal. The use of the phrase "based on," unless otherwise explicitly stated or clear from context, means "based at least in part on" and is not limited to "based solely on."

Conjunctive language, such as phrases of the form "at least one of A, B, and C," or "at least one of A, B and C," (i.e., the same phrase with or without the Oxford comma) unless specifically stated otherwise or otherwise clearly contradicted by context, is otherwise understood within the context as used in general to present that an item, term, etc., may be either A or B or C, any nonempty subset of the set of A and B and C, or any set not contradicted by context or otherwise excluded that contains at least one A, at least one B, or at least one C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}, and, if not contradicted explicitly or by context, any set having {A}, {B}, and/or {C} as a subset (e.g., sets with multiple "A"). Thus, such conjunctive language is not generally intended to imply that certain embodiments require at least one of A, at least one of B and at least one of C each to be present. Similarly, phrases such as "at least one of A, B, or C" and "at least one of A, B or C" refer to the same as "at least one of A, B, and C" and "at least one of A, B and C" refer to any of the following sets: {A}, {B}, {C}, {A, B}, {A, C}, {B, C}, {A, B, C}, unless differing meaning is explicitly stated or clear from context. In addition, unless otherwise noted or contradicted by context, the term "plurality" indicates a state of being plural (e.g., "a plurality of items" indicates multiple items). The number of items in a plurality is at least two but can be more when so indicated either explicitly or by context.

Operations of processes described herein can be performed in any suitable order unless otherwise indicated herein or otherwise clearly contradicted by context. In an embodiment, a process such as those processes described herein (or variations and/or combinations thereof) is performed under the control of one or more computer systems configured with executable instructions and is implemented as code (e.g., executable instructions, one or more computer programs or one or more applications) executing collectively on one or more processors, by hardware or combinations thereof. In an embodiment, the code is stored on a computer-readable storage medium, for example, in the form of a computer program comprising a plurality of instructions executable by one or more processors. In an embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In an embodiment, code (e.g., executable code or source code) is stored on a set of one or more non-transitory computer-readable storage media having stored thereon executable instructions that, when executed (i.e., as a result of being executed) by one or more processors of a computer system, cause the computer system to perform operations described herein. The set of non-transitory computer-readable storage media, in an embodiment, comprises multiple non-transitory computer-readable storage media, and one or more of individual non-transitory storage media of the multiple non-transitory computer-readable storage media lack all of the code while the multiple non-transitory computer-readable storage media collectively store all of the code. In an embodiment, the executable instructions are executed such that different instructions are executed by different processors—for example, in an embodiment, a non-transitory computer-readable storage medium stores instructions and a main CPU executes some of the instructions while a graphics processor unit executes other instructions. In another embodiment, different components of a computer system have separate processors and different processors execute different subsets of the instructions.

Accordingly, in an embodiment, computer systems are configured to implement one or more services that singly or collectively perform operations of processes described herein, and such computer systems are configured with applicable hardware and/or software that enable the performance of the operations. Further, a computer system, in an embodiment of the present disclosure, is a single device and, in another embodiment, is a distributed computer system comprising multiple devices that operate differently such that the distributed computer system performs the operations described herein and such that a single device does not perform all operations.

The use of any and all examples or exemplary language (e.g., "such as") provided herein is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references including publications, patent applications, and patents cited herein are hereby incorporated by reference to the same extent as if each reference were individually and specifically indicated to be incorporated by reference and were set forth in its entirety herein.

What is claimed is:

1. A computer-implemented method, comprising:
obtaining, from a customer of a simulation management service, a request to train a model for a system, the request specifying parameters for simulation of the system and training of the model for the system; and
fulfilling the request by at least:
configuring a first virtual compute node with a training application to train the model;
configuring a second virtual compute node with a simulation application;
running, at the second virtual compute node, a simulation of the system in a simulation environment;
causing a robotic device in the simulation environment to perform an action, wherein the simulation uses the model to randomize selection of the action to perform;
obtaining data indicating how the system performed in the simulation environment; and
providing the data to the training application running on the first virtual compute node to cause the training application to use the data to train the model.

2. The computer-implemented method of claim 1, wherein the method further comprises storing the data in a memory buffer accessible to the training application.

3. The computer-implemented method of claim 1, wherein the data includes at least an action performed by the system in response to an initial state of the simulation environment, a new state resulting from the action, and a reward value corresponding to the action performed and a change from the initial state to the new state.

4. The computer-implemented method of claim 1, wherein the method further comprises:
obtaining, from the first virtual compute node, an updated model generated by the training application using the data;
updating the simulation at the second virtual compute node to incorporate the updated model;
running the simulation of the system to obtain second data indicating how the system performed in the simulation environment; and
providing the second data to the training application to cause the training application to use the second data to train the updated model.

5. A system, comprising:
one or more processors; and
memory that stores computer-executable instructions that, if executed, cause the system to:
obtain parameters for simulation of a second system and training of a model for the second system, wherein the model is a randomized reinforcement learning model;
configure a first virtual compute node with a training application to train the model;

configure a second virtual compute node with a simulation application to perform the simulation of the second system in a simulation environment;

run the simulation at the second virtual compute node to obtain data indicating how a simulated second system performed in the simulation environment; and transmit, from the second virtual compute node, the data to the first virtual compute node to cause the training application to use the data to train the model.

6. The system of claim 5, wherein the computer-executable instructions that cause the system to transmit the data to the first virtual compute node further cause the system to add the data to a ring memory buffer in an order in which the data is generated to cause the first virtual compute node to obtain the data in the order in which the data is generated from the ring memory buffer.

7. The system of claim 5, wherein the computer-executable instructions further cause the system to:

obtain, from the first virtual compute node, an updated model;

update the simulation at the second virtual compute node to incorporate the updated model;

run the simulation to obtain second data indicating how the simulated second system performed in the simulation environment; and transmit, from the second virtual compute node, the second data to the first virtual compute node to cause the training application to use the second data to train the updated model.

8. The system of claim 7, wherein the computer-executable instructions further cause the system to:

obtain, from the first virtual compute node, an indication that a termination requirement for the simulation has been satisfied in response to output from the training application using the second data as input to train the updated model; and make available the updated model for optimizing an application of the second system in response to the indication.

9. The system of claim 8, wherein the termination requirement is satisfied as a result of a determination, by the training application, that a maximum number of iterations of the simulation have been performed to update the model.

10. The system of claim 8, wherein the termination requirement is satisfied as a result of a determination, by the training application, that a statistic involving a reward value for the simulation satisfies a condition on the reward value.

11. The system of claim 5, wherein the simulation application performs the simulation of the second system in the simulation environment by at least:

selecting a state for the second system as input to cause the simulated second system to perform an action in response to the state;

obtaining, in response to the action, a reward value corresponding to performance of the action in the simulation environment in response to the state; and utilizing the reward value to generate the data.

12. The system of claim 5, wherein the data includes at least an initial state of the second system in the simulation environment, an action performed by the simulated second system in response to the initial state, a new state of the simulated second system in the simulation environment resulting from the action, and a reward value corresponding to the action performed.

13. A non-transitory computer-readable storage medium storing thereon executable instructions that, as a result of being executed by one or more processors of a computer system, cause the computer system to at least:

configure a first virtual compute node with a training application to train, using data from a simulation of a second system in a simulation environment, a model for the second system;

configure a second virtual compute node with a simulation application;

run, at least in part by randomizing performance of an action during the simulation, the simulation at the second virtual compute node to obtain the data; and provide the data to the first virtual compute node to cause the training application to use the data to train the model.

14. The non-transitory computer-readable storage medium of claim 13, wherein configuration of the second virtual compute node with the simulation application causes the simulation application to:

select a set of states and a set of actions for the second system in the simulation environment;

determine, based on performance of the set of actions by the second system in the simulation environment based on the set of states, a reward value; and generate, using the reward value, the data.

15. The non-transitory computer-readable storage medium of claim 13, wherein configuration of the second virtual compute node with the simulation application causes the simulation application to:

select a state for the second system in the simulation environment;

determine, based on performance of an action by the second system in the simulation environment based on the state, a reward value; and generate, using the reward value, the data.

16. The non-transitory computer-readable storage medium of claim 13, wherein the executable instructions that cause the computer system to provide the data to the first virtual compute node further cause the computer system to add the data to a memory buffer accessible by the first virtual compute node in an order in which the data is added to the memory buffer.

17. The non-transitory computer-readable storage medium of claim 13, wherein the executable instructions further cause the computer system to:

obtain, from the first virtual compute node, an updated model;

run the simulation at the second virtual compute node using the updated model to obtain second data; and provide the second data to the first virtual compute node to cause the training application to use the second data to train the updated model.

18. The non-transitory computer-readable storage medium of claim 17, wherein the executable instructions further cause the computer system to:

obtain a notification from the first virtual compute node that indicates that a termination condition for the simulation has been satisfied based on processing of the second data; and make available the updated model for optimizing an application of the second system in response to the notification.

19. The non-transitory computer-readable storage medium of claim 18, wherein the termination condition is satisfied as a result of a maximum amount of time having elapsed from execution of the simulation application at the second virtual compute node to obtain the data.

20. The non-transitory computer-readable storage medium of claim 18, wherein the termination condition is satisfied as a result of a maximum number of iterations of the simulation having been performed for updating the model.

21. The computer-implemented method of claim 1, wherein:
- the computer-implemented method further comprises terminating the simulation upon fulfilment of a termination condition; and
- the termination condition is:
    - an entropy value for the simulation reaching a threshold entropy value, expiration of a timeout, or
    - a threshold reward value being attained over a certain number of iterations of the simulation.

* * * * *